US011195901B2

(12) United States Patent
Park et al.

(10) Patent No.: US 11,195,901 B2
(45) Date of Patent: Dec. 7, 2021

(54) BENDABLE DISPLAY DEVICE

(71) Applicant: SAMSUNG DISPLAY CO., LTD., Yongin-si (KR)

(72) Inventors: Hyungjun Park, Yongin-si (KR); Wonkyu Kwak, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/781,555

(22) Filed: Feb. 4, 2020

(65) Prior Publication Data

US 2020/0174528 A1 Jun. 4, 2020

Related U.S. Application Data

(63) Continuation of application No. 15/871,631, filed on Jan. 15, 2018, now Pat. No. 10,551,877.

(30) Foreign Application Priority Data

Aug. 7, 2017 (KR) ........................ 10-2017-0099784

(51) Int. Cl.
*G06F 1/16* (2006.01)
*H01L 27/32* (2006.01)
*G02F 1/1333* (2006.01)
*G02F 1/1345* (2006.01)
*H01L 27/12* (2006.01)
(Continued)

(52) U.S. Cl.
CPC ...... *H01L 27/3276* (2013.01); *G02F 1/13458* (2013.01); *G02F 1/133305* (2013.01); *G06F 1/1652* (2013.01); *H01L 27/124* (2013.01); *H01L 27/3262* (2013.01); *H01L 51/0097* (2013.01); *H01L 51/56* (2013.01);
(Continued)

(58) Field of Classification Search
CPC .............. H01L 27/3276; H01L 27/124; H01L 27/3262; G02F 1/133305; G02F 1/13458; G06F 1/1652
USPC ......................................................... 361/749
See application file for complete search history.

(56) References Cited

U.S. PATENT DOCUMENTS 8,558,239 B2 10/2013 Lee et al.
10,551,877 B2 2/2020 Park et al.
(Continued)

FOREIGN PATENT DOCUMENTS

EP 3 182 473 A1 6/2017
EP 3 236 309 10/2017
(Continued)

OTHER PUBLICATIONS

Extended European Search Report dated Jan. 7, 2019 for Application Serial No. 18187565.9.
With Partial English Translation of Relevant Part.

*Primary Examiner* — Tremesha S Willis
(74) *Attorney, Agent, or Firm* — F. Chau & Associates, LLC

(57) ABSTRACT

A display device includes a substrate having a first area, a second area, and a bending area disposed between the first area and the second area. An inner wiring is disposed in the first area. An outer wiring is disposed in the second area. An interlayer insulating layer covers the inner wiring and the outer wiring, and includes a first contact hole. A conductive layer is disposed on the interlayer insulating layer, and is connected to the inner wiring or the outer wiring through the first contact hole. An inorganic protective layer covers at least a portion of the conductive layer and includes an inorganic insulating material.

18 Claims, 16 Drawing Sheets

(51) Int. Cl.
    *H05K 1/02*         (2006.01)
    *H01L 51/00*       (2006.01)
    *H01L 51/56*       (2006.01)

(52) U.S. Cl.
    CPC .......... *H05K 1/028* (2013.01); *H01L 27/3258* (2013.01); *H01L 2251/558* (2013.01)

(56) References Cited

U.S. PATENT DOCUMENTS

| | | |
|---|---|---|
| 2014/0217397 A1 | 8/2014 | Kwak et al. |
| 2014/0299884 A1 | 10/2014 | Park et al. |
| 2016/0226024 A1 | 8/2016 | Park et al. |
| 2017/0125505 A1 | 5/2017 | Oh |
| 2018/0231823 A1 | 8/2018 | Hyodo et al. |
| 2019/0041915 A1 | 2/2019 | Park et al. |

FOREIGN PATENT DOCUMENTS

| | | |
|---|---|---|
| KR | 10-2011-0051858 | 5/2011 |
| KR | 10-2014-0099139 | 8/2014 |
| KR | 10-2014-0129647 | 11/2014 |

BENDABLE DISPLAY DEVICE

CROSS-REFERENCE TO RELATED APPLICATION

This application is a Continuation of co-pending U.S. patent application Ser. No. 15/871,631, filed on Jan. 15, 2018, which claims the benefit of Korean Patent Application No. 10-2017-0099784, filed on Aug. 7, 2017, in the Korean Intellectual Property Office, the disclosure of which is incorporated by reference herein in its entirety.

TECHNICAL FIELD

The present disclosure relates to a display device, and more specifically to a bendable display device.

DISCUSSION OF THE RELATED ART

A display device may be used in a wide variety of devices. Modern flat panel display devices, such as liquid crystal displays (LCDs) and organic light emitting diode (OLED) displays tend to be thin and lightweight, as compared to older styles of display devices. More recently, many flat panel display devices have the ability to be bent at some point during manufacturing so as to obtain a desired shape.

SUMMARY

A display device includes a substrate having a first area, a second area, and a bending area disposed between the first area and the second area. An inner wiring is disposed in the first area. An outer wiring is disposed in the second area. An interlayer insulating layer covers the inner wiring and the outer wiring, and includes a first contact hole. A conductive layer is disposed on the interlayer insulating layer, and is connected to the inner wiring or the outer wiring through the first contact hole. An inorganic protective layer covers at least a portion of the conductive layer and includes an inorganic insulating material.

A display device includes a display area configured to display an image. The display area includes a plurality of pixels. A non-display area is adjacent to the display area. The non-display area includes a bending area. A wiring is disposed in the non-display area. An interlayer insulating layer includes a first contact hole corresponding to the wiring and includes an opening corresponding to the bending area. A conductive layer is disposed on the interlayer insulating layer, and is connected to the wiring through the first contact hole. An inorganic protective layer is disposed on the conductive layer, and covers at least a portion of the conductive layer corresponding to the first contact hole. The inorganic protective layer includes an inorganic insulating material.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
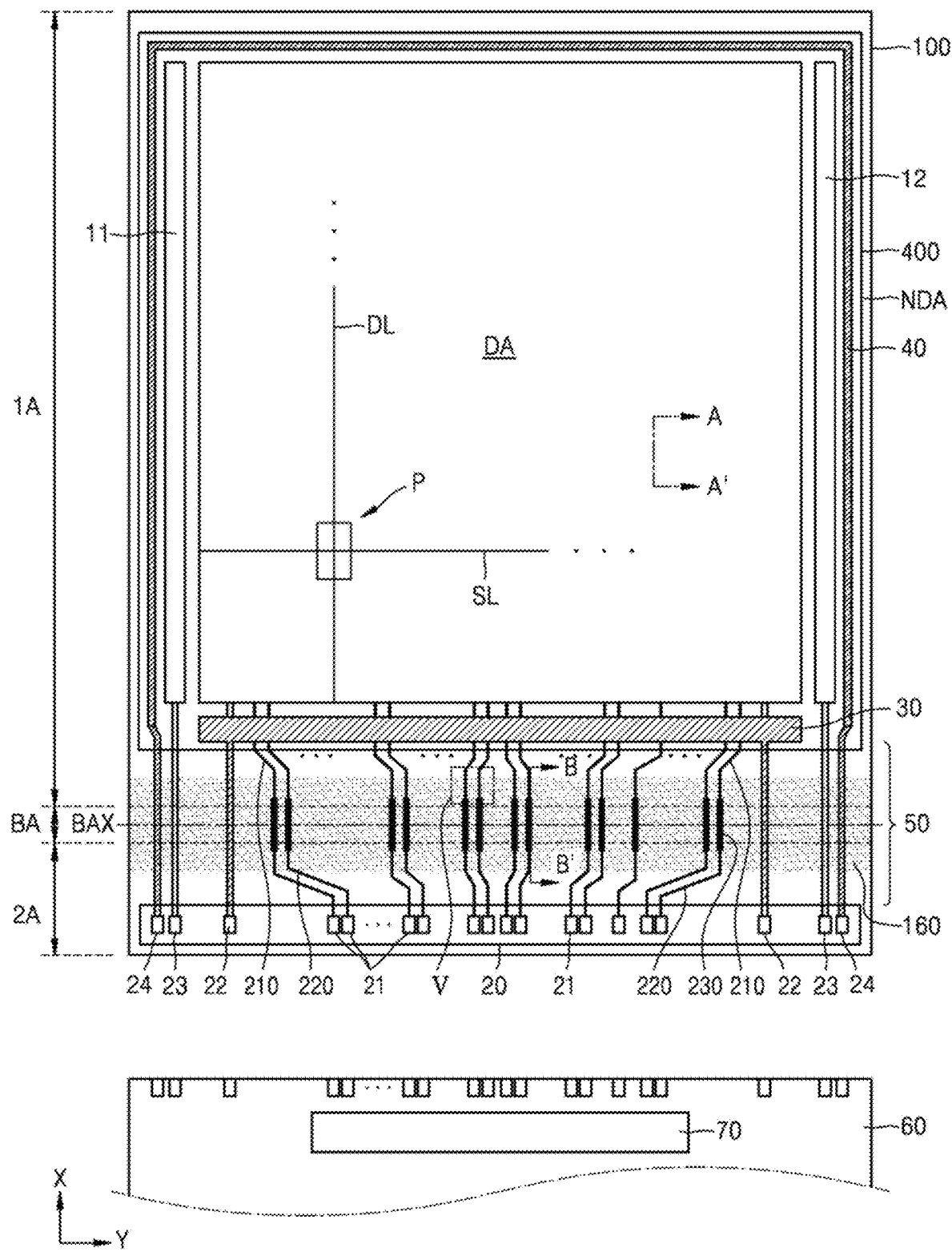
FIG. 1 is a plan view illustrating a display device according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Like reference numerals in the specification and the drawings may denote like or corresponding elements, and to the extent that repeated description thereof is omitted, it may be assumed that the omitted description is at least similar to descriptions of corresponding elements found elsewhere in the specification.

It will be understood that although the terms "first", "second", etc. may be used herein to describe various components, these components are only used to distinguish one component from another.

It will be understood that when a layer, region, or component is referred to as being "formed on," or "disposed on" another layer, region, or component, it can be directly on or intervening layers, regions, or components may be present.

Sizes of elements in the drawings may be exaggerated for convenience of explanation.

It will be understood that when a layer, region, or component is referred to as being "connected" to another layer, region, or component, it may be directly connected to the other layer, region, or there may be other layers, regions, or components interposed therebetween.

A display device is an apparatus displaying an image. The display device may be a liquid crystal display, an electrophoretic display, an organic light-emitting display, an inorganic light-emitting display, a field emission display, a surface-conduction electron-emitter display, a plasma display, a cathode ray display, etc.

Hereinafter, though an organic light-emitting display is exemplarily described as a display device, the display device according to the present disclosure is not limited thereto and various types of display devices may be used.

Figure 2:
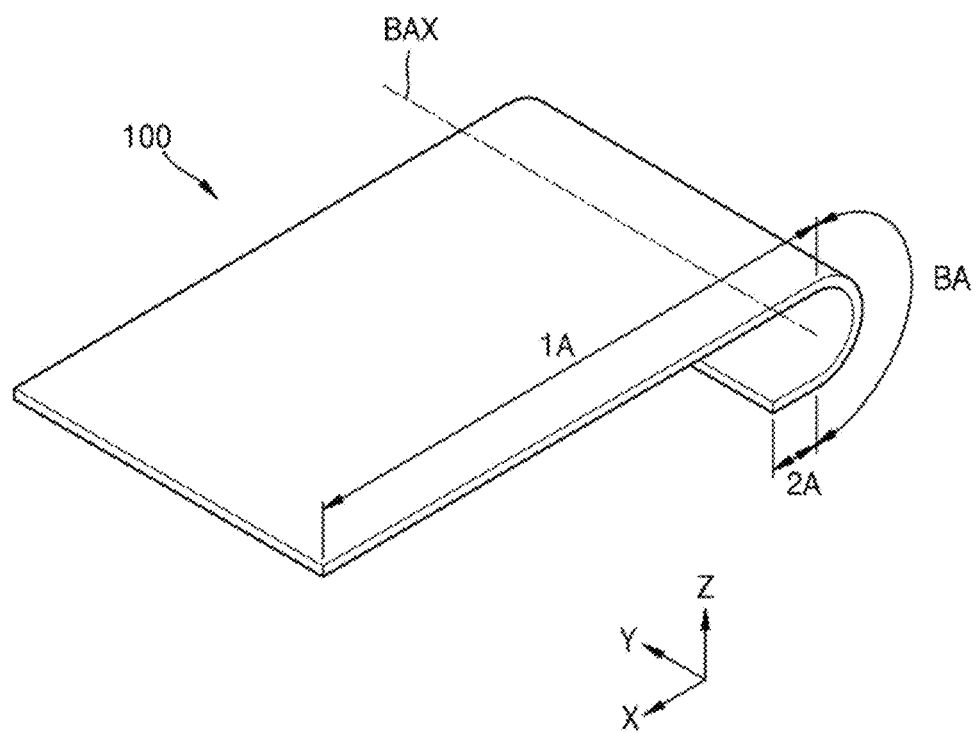
FIG. 2 is a perspective view illustrating a portion of a display device according to an exemplary embodiment of the present invention.

FIG. 1 is a plan view of a display device according to an exemplary embodiment of the preset invention, and FIG. 2 is a perspective view of a portion of a display device according to an exemplary embodiment of the preset invention.

Referring to FIGS. 1 and 2, a substrate 100 may include a bending area BA extending in a first direction (a Y-direction). The bending area BA may be disposed between a first area 1A and a second area 2A along a second direction (an X-direction) crossing the first direction.

The substrate 100 may be bent about a bending axis BAX extending in the first direction. Though FIG. 2 illustrates that the substrate 100 is bent at the same curvature radius around the bending axis BAX, the invention is not limited thereto. The substrate 100 may be bent around the bending axis BAX and a curvature radius thereof may be varied.

The substrate 100 may include various flexible or bendable materials, e.g., polymer resins such as polyethersulphone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), and/or cellulose acetate propionate (CAP). The substrate 100 may have a single-layered or multi-layered structure including the above materials. The multi-layered structure may further include an inorganic layer.

The first area 1A may include a display area DA. As illustrated in FIG. 1, the first area 1A may include the display area DA and a portion of a non-display area NDA outside the display area DA. The second area 2A and the bending area BA may include the non-display area NDA. The display area DA of the display device may correspond to a portion of the first area 1A, and the non-display area NDA may correspond to the rest of the first area 1A, the second area 2A, and the bending area BA.

The display area DA includes pixels P and may display an image. A pixel P may be connected to signal lines such as a scan line SL extending in the first direction and a data line DL extending in the second direction. In FIG. 1, a pixel P may be connected to power lines transferring a direct-current (DC) signal such as a driving power line and a common power line.

A pixel P may include electronic elements such as a thin film transistor (TFT) and a storage capacitor electrically connected to the signal lines and power lines, and an organic light-emitting device (OLED) connected to the electronic elements. A pixel P may emit, for example, red, green, blue, or white light through the OLED. The pixel P may be understood herein as being a pixel emitting red, green, or blue light, or a pixel emitting red, green, blue, or white light.

The display area DA may be covered by an encapsulation layer 400 so as to protect the display area DA from external air or moisture. In the case where a display element provided to a pixel P is an OLED, the TFT may include a driving TFT and a switching TFT, and may further include an additional TFT in addition to the two TFTs depending on design of the pixel P.

The non-display area NDA may include first and second scan drivers 11 and 12, a terminal unit 20, a driving voltage supply line 30, a common voltage supply line 40, and a wiring unit 50.

The first and second scan drivers 11 and 12 may be disposed in the first area 1A. For example, the first and second scan drivers 11 and 12 may be spaced apart from each other with the display area DA therebetween. The first and second scan drivers 11 and 12 may generate and transfer a scan signal to each pixel P through the scan line SL. In FIG. 1, two scan drivers are disposed, however, the present invention is not limited to using exactly two scan drivers. For example, one scan driver may be disposed on one side of the display area DA.

The terminal unit 20 may be disposed at one end of the non-display area NDA and includes terminals 21, 22, 23, and 24. The terminal unit 20 might not be exposed by an insulating layer and be exposed and connected to a flexible film 60 such as a flexible printed circuit board including a driver integrated circuit (IC) 70. FIG. 1 illustrates a chip on film (COF) type driver IC in which the driver IC 70 is connected through the flexible film 60, however, the present invention is not limited thereto and other configurations may be used. For example, the driver IC 70 may be a chip on panel (COP) type driver IC in which the driver IC 70 is directly disposed on the terminal unit 20 of the substrate 100.

The driving voltage supply line 30 may provide a driving voltage ELVDD to pixels P. The driving voltage supply line 30 may be disposed in the non-display area NDA such that the driving voltage supply line 30 is adjacent to one side of the display area DA.

The common voltage supply line 40 may provide a common voltage ELVSS to pixels P. The common voltage supply line 40 may be disposed in the non-display area NDA to partially surround the display area DA.

The wiring unit 50 may include inner wirings 210 disposed in the first area 1A, outer wirings 220 disposed in the second area 2A, and conductive layers 230, which are bridge wirings electrically connecting the inner wirings 210 to the outer wirings 220. Each inner wiring 210 may be electrically connected to a signal line of the display area DA, and each outer wiring 220 may be electrically connected to the terminal unit 20 of the non-display area NDA.

Figure 3:
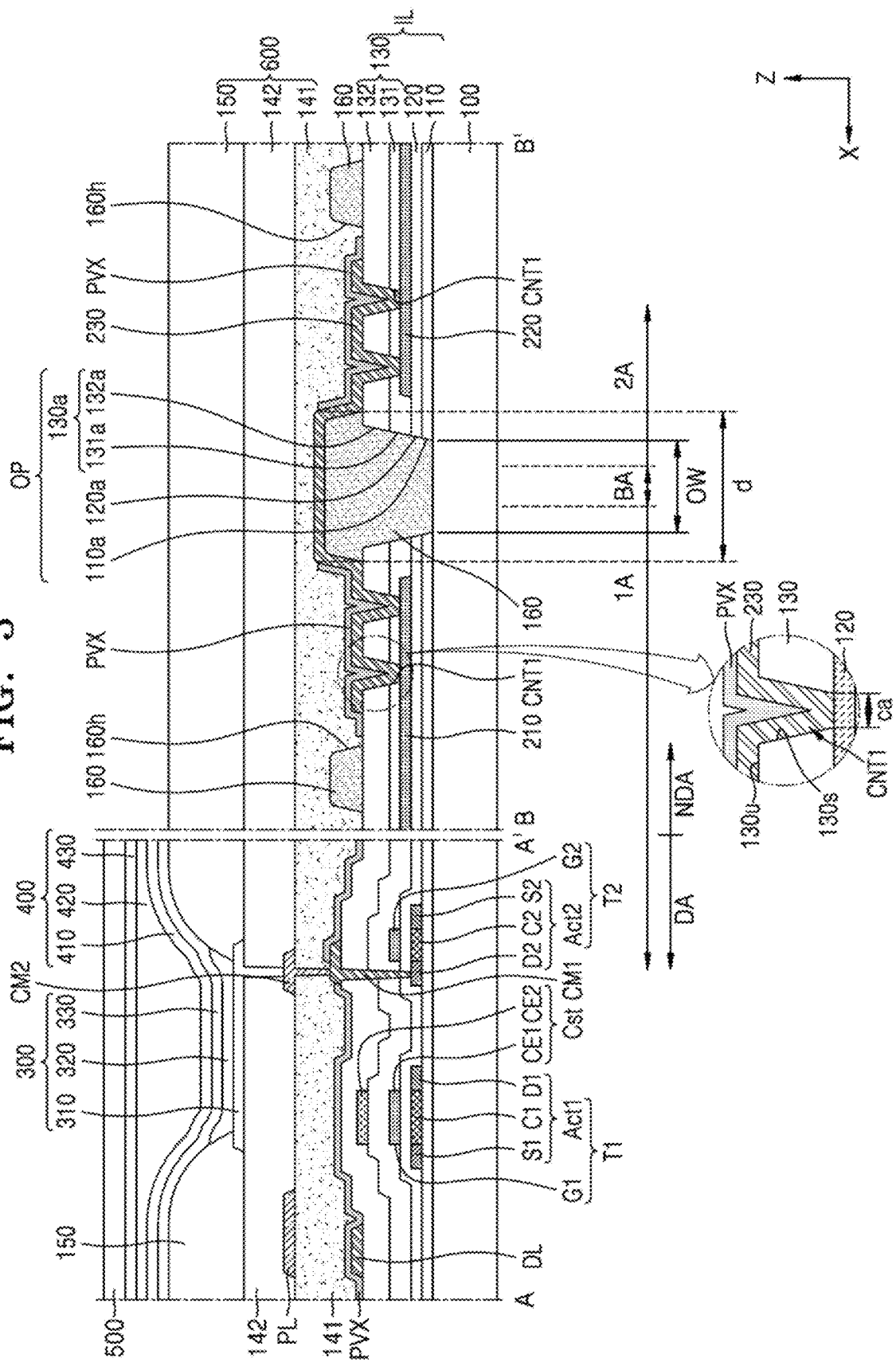
FIG. 3 is a cross-sectional view illustrating a display device according to an exemplary embodiment of the present invention.

The conductive layer 230 may extend from the first area 1A to the second area 2A across the bending area BA. The conductive layer 230 may cross the bending axis BAX described with reference to FIG. 2. FIG. 3 illustrates that the conductive layer 230, which is a bridge wiring, extends perpendicularly with respect to the bending axis BAX, however, the present invention is not limited to this particular arrangement. For example, the conductive layer 230 may obliquely extend at a predetermined angle with respect to the bending axis BAX, or extend while having a curved shape, a zigzag shape, etc., rather than in a straight line shape.

An organic layer 160 may be disposed in at least the bending area BA. The organic layer 160 at least partially overlaps the conductive layer 230, one side of the organic layer 160 may extend over the first area 1A, and the other side of the organic layer 160 may extend over the second area 2A. In an exemplary embodiment of the present invention, the organic layer 160 may be disposed below the conductive layer 230, for example, disposed between the substrate 100 and the conductive layer 230, and may surround a contact portion between the conductive layer 230 and the inner wiring 210, and a contact portion between the conductive layer 230 and the outer wiring 220.

FIG. 3 is a cross-sectional view of the display device according to an exemplary embodiment of the present invention, taken along lines A-A' and B-B' of FIG. 1.

Referring to FIG. 3, an OLED 300 as a display element may be disposed in the display area DA. The OLED 300 may be electrically connected to first and second TFTs T1 and T2 and a storage capacitor Cst. The first TFT T1 includes a first semiconductor layer Act1 and a first gate electrode G1. The second TFT T2 includes a second semiconductor layer Act2 and a second gate electrode G2.

The first semiconductor layer Act1 and the second semiconductor layer Act2 may each include amorphous silicon, polycrystalline silicon, an oxide semiconductor, or an organic semiconductor material. The first semiconductor layer Act1 includes a channel region C1, and a source region S1 and a drain region D1 respectively disposed at opposite sides of the channel region C1. The second semiconductor layer Act2 includes a channel region C2, and a source region S2 and a drain region D2 respectively disposed at opposite sides of the channel region C2. The source regions S1 and S2 and the drain regions D1 and D2 of the first and second semiconductor layers Act1 and Act2 may be respectively understood as source electrodes and drain electrodes of the first and second TFTs T1 and T2.

The first gate electrode G1 and the second gate electrode G2 may respectively at least partially overlap the channel region C1 of the first semiconductor layer Act1 and the channel region C2 of the second semiconductor layer Act2 with a gate insulating layer 120 therebetween. The first and second gate electrodes G1 and G2 may each be a single layer or may each have multiple layers including a conductive material including at least one of Mo, Al, Cu, and Ti. FIG. 3 illustrates that the first and second gate electrodes G1 and G2 are disposed on the same layer, however, the present invention is not limited thereto. For example, the first and second gate electrodes G1 and G2 may be respectively disposed on different layers. FIG. 3 illustrates top-gate type TFTs in which the first and second gate electrodes G1 and G2 are respectively disposed over the first and second semiconductor layers Act1 and Act2, however, the present invention is not limited to this particular arrangement. For example, TFTs may be bottom-gate type TFTs in which the first and second gate electrodes G1 and G2 are disposed below the first and second semiconductor layers Act1 and Act2.

The storage capacitor Cst may include a first storage capacitor plate CE1 and a second storage capacitor plate CE2 which at least partially overlap each other. The first and second storage capacitor plates CE1 and CE2 may include a low-resistance conductive material including at least one of Mo, Al, Cu, and Ti.

The storage capacitor Cst may at least partially overlap the first TFT T1, and the first TFT T1 may be a driving TFT. Though FIG. 3 illustrates that the storage capacitor Cst at least partially overlaps the first TFT T1 and so the first storage capacitor plate CE1 serves as the first gate electrode G1 of the first TFT T1, the embodiment is not limited thereto. In another embodiment, the storage capacitor Cst might not overlap the first TFT T1.

A buffer layer 110 may be disposed between the substrate 100 and the first and second TFTs T1 and T2. The buffer layer 110 may include an inorganic insulating material. For example, the buffer layer 110 may be a single layer or multiple layers including at least one of SiON, SiOx, and SiNx.

The gate insulating layer 120 may be disposed between the first and second gate electrodes G1 and G2 and the first and second semiconductor layers Act1 and Act2. The gate insulating layer 120 may include an inorganic insulating layer. For example, the gate insulating layer 120 may be a single layer or multiple layers including at least one of SiON, SiOx, and SiNx.

The first and second TFTs T1 and T2 may be covered by an interlayer insulating layer 130. FIG. 3 illustrates that the interlayer insulating layer 130 includes first and second interlayer insulating layers 131 and 132. The first interlayer insulating layer 131 may be disposed on the first and second TFTs T1 and T2 and/or on the first storage capacitor plate CE1. The second interlayer insulating layer 132 may be disposed on the second storage capacitor plate CE2. Each of the first and second interlayer insulating layers 131 and 132 may be a single layer or multiple layers including at least one of SiON, SiOx, and SiNx. In an exemplary embodiment of the present invention, the first interlayer insulating layer 131 may be a single layer including SiNx, and the second interlayer insulating layer may be multiple layers including SiNx and SiOx. The interlayer insulating layer 130 is described herein as being an insulating layer disposed between the inner wiring 210 and the conductive layer 230 and/or the outer wiring 220 and the conductive layer 230, and may be understood to represent the first interlayer insulating layer 131 or represent the second interlayer insulating layer 132, or represent the first and second interlayer insulating layers 131 and 132.

The data line DL may be disposed on the interlayer insulating layer 130. The data line DL may be electrically connected to a switching TFT and may provide a data signal. The data line DL may be a single layer or multiple layers including at least one of Al, Cu, Ti, and an alloy thereof. In an embodiment, the data line DL may be three layers including Ti/Al/Ti.

The data line DL may be covered by an inorganic protective layer PVX. The inorganic protective layer PVX may be a single layer or multiple layers including SiNx and SiOx. The inorganic protective layer PVX may cover and protect some of wirings exposed from the non-display area NDA. Wirings formed simultaneously with the data line DL during the same process may be exposed at a portion of the substrate 100 (for example, a portion of the non-display area NDA). The exposed portion of the wirings may be damaged by an etchant used when a pixel electrode 310 is patterned. Since the inorganic protective layer PVX covers the data line DL and at least a portion of the wirings simultaneously formed with the data line DL, the wirings may be prevented from being damaged during a patterning process of the pixel electrode 310.

A driving voltage line PL and the data line DL may be disposed in different layers, for example, with one layer being above the other layer. A first planarization insulating layer 141 may be disposed between the driving voltage line PL and the data line DL.

The driving voltage line PL may be a single layer or multiple layers including at least one of Al, Cu, Ti, and an alloy thereof. According to an exemplary embodiment of the present invention, the driving voltage line PL may be a triple layer including Ti/Al/Ti. FIG. 3 illustrates that the driving voltage line PL is disposed on only the first planarization insulating layer 141, however, the present invention is not limited thereto. For example, the driving voltage line PL may be connected to a lower additional voltage line that is formed simultaneously with the data line DL through a through hole formed in the first planarization insulating layer 141. This arrangement may reduce a resistance as compared to a comparable arrangement without the aforementioned lower additional voltage line connected to the driving voltage line PL via the through hole.

A second planarization insulating layer 142 may cover the driving voltage line PL. The first and second planarization insulating layers 141 and 142 may include an organic material. The organic material may include a general-purpose polymer such as an imide-based polymer, polymethylmethacrylate (PMMA) or polystyrene (PS), or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof.

The OLED 300 includes the pixel electrode 310, an opposite electrode 330, and an intermediate layer 320 disposed between the pixel electrode 310 and the opposite electrode 330 and including an emission layer. The OLED 300 may be disposed on the second planarization insulating layer 142.

A pixel-defining layer 150 may be disposed on the pixel electrode 310. The pixel-defining layer 150 defines a pixel by having an opening corresponding to each pixel. For example, each opening may expose at least a central portion of the pixel electrode 310. Also, the pixel-defining layer 150 may prevent arcing, etc. from occurring between the pixel electrode 310 and the opposite electrode 330 by increasing a distance between the edge of the pixel electrode 310 and the opposite electrode 330. The pixel-defining layer 150 may include, for example, an organic material such as PI or hexamethyldisiloxane (HMDSO).

The pixel electrode 310 may be electrically connected to a pixel circuit including, for example, the first and second TFTs T1 and T2 and the storage capacitor Cst through a first connection metal CM1 and a second connection metal CM2.

The intermediate layer 320 may include a low molecular or polymer material. In the case where the intermediate layer 320 includes a low molecular material, the intermediate layer 320 may have a structure in which a hole injection layer (HIL), a hole transport layer (HTL), an emission layer (EML), an electron transport layer (ETL), an electron injection layer (EIL), etc. are stacked in a single or a composite configuration, and may include various organic materials such as copper phthalocyanine (CuPc), N,N'-Di(naphthalene-1-yl)-N,N'-diphenyl-benzidine (NPB), and tris-8-hydroxyquinoline aluminum (Alq3). These layers may be formed by vacuum evaporation.

In the case where the intermediate layer 320 includes a polymer material, the intermediate layer 320 may generally have a structure including an HTL and an EML. In this case, the HTL may include PEDOT, and the EML may include a polymer material such as polyphenylene vinylene (PPV)-based material and a polyfluorene-based material. The structure of the intermediate layer 320 is not limited to the above-described structure and may have various structures. For example, the intermediate layer 320 may include a layer having one body over a plurality of pixel electrodes 310 or may include a layer patterned to respectively correspond to the plurality of pixel electrodes 310.

The opposite electrode 330 may cover the display area DA. For example, the opposite electrode 330 may have one body over a plurality of OLEDs 300.

Since the OLED 300 may be easily damaged by external moisture or oxygen, the OLED 300 may be protected by being covered by an encapsulation layer 400. The encapsulation layer 400 may cover the display area DA and extend to the outside of the display area DA. The encapsulation layer 400 includes at least one inorganic insulating layer and at least one organic insulating layer. For example, the encapsulation layer 400 may include a first inorganic encapsulation layer 410, an organic encapsulation layer 420, and a second inorganic encapsulation layer 430.

The first inorganic encapsulation layer 410 may cover the opposite electrode 330 and include SiOx, SiNx, and/or SiON. Other layers such as a capping layer may be disposed between the first inorganic encapsulation layer 410 and the opposite electrode 330. Since the first inorganic encapsulation layer 410 runs along a structure thereunder, an upper surface of the first inorganic encapsulation layer 410 is not planarized. The organic encapsulation layer 420 covering the first inorganic encapsulation layer 410 may have a flat upper surface at least corresponding to the display area DA. The organic encapsulation layer 420 may include at least one of PET, PEN, PC, PI, polyethylene sulfonate, polyoxymethylene (POM), PAR, and HMDSO. The second inorganic encapsulation layer 430 may cover the organic encapsulation layer 420 and include SiOx, SiNx, and/or SiON.

An optical film 500 may be disposed on the encapsulation layer 400. The optical film 500 may include a polarization plate. The polarization plate may reduce external light reflection, and a layer including a black matrix and a color filter may be used instead of the polarization plate. Various functional layers including touch electrode layers may be further provided on the encapsulation layer 400.

Referring to the non-display area NDA around the bending area BA of FIG. 3, the buffer layer 110, the gate insulating layer 120, and the interlayer insulating layer 130 disposed over the substrate 100 may be collectively referred to as inorganic insulating layer IL. The inorganic insulating layer IL has an opening OP corresponding to the bending area BA. As used herein, the term "correspond" may be understood as overlapping in the vertical direction, as illustrated. The buffer layer 110, the gate insulating layer 120, and the interlayer insulating layer 130 may respectively have an opening 110a, an opening 120a, and an opening 130a corresponding to the bending area BA. The opening 130a of the interlayer insulating layer 130 may include an opening 131a and an opening 132a respectively of the first interlayer insulating layer 131 and the second interlayer insulating layer 132. Though FIG. 3 illustrates that the opening OP passes through the inorganic insulating layer IL, the present invention is not limited thereto. For example, according to an exemplary embodiment of the present invention, the inorganic insulating layer IL may have a recess (or a groove) corresponding to the bending area BA. The recess may mean a portion formed by removing a portion of the inorganic insulating layer IL in a depth direction and leaving a portion of the inorganic insulating layer IL. For example, the gate insulating layer 120 and the interlayer insulating layer 130 may respectively have the openings 120a and 130a corresponding to the bending area BA, but the buffer layer 110 may continuously extend over the first area 1A, the bending area BA, and the second area 2A without having an opening.

The area of the opening OP may be greater than the area of the bending area BA. FIG. 3 illustrates that a width OW of the opening OP is greater than the width of the bending area BA. The area of the opening OP may be defined as the area of a smallest opening among the openings 110a, 120a, and 130a respectively of the buffer layer 110, the gate insulating layer 120, and the interlayer insulating layer 130. FIG. 3 illustrates that the area of the opening OP of the inorganic insulating layer IL is defined by the area of the opening 110a of the buffer layer 110. Though FIG. 3 illustrates that an inner surface of the opening 110a of the buffer layer 110 coincides with an inner surface of the opening 120a of the gate insulating layer 120, the present invention is not limited thereto. For example, the area of the opening 130a of the interlayer insulating layer 130 may be greater than the area of the opening 120a of the gate insulating layer 120.

The organic layer 160 may fill the opening OP of the inorganic insulating layer IL. The organic layer 160 at least partially overlaps the bending area BA, and at least a portion of the organic layer 160 may be disposed inside the opening OP of the inorganic insulating layer IL. The organic layer 160 may extend from the bending area BA to a non-bending area, for example, a portion of the first and second areas 1A and 2A adjacent to the bending area BA.

The organic layer 160 may include at least one of acryl, metacrylic, polyester, polyethylene, polypropylene, PET, PEN, PC, PI, polyethylenesulfonate, polyoxymethylene, PAR, and HMDSO.

The inner wiring 210 is disposed in the first area 1A of the non-display area NDA, and the outer wiring 220 is disposed in the second area 2A.

The inner wiring 210 may be electrically connected to a pixel of the display area DA. For example, the inner wiring 210 may be electrically connected to the first and second TFTs T1 and T2 and/or a wiring such as the data line DL, and the pixel circuit is electrically connected to the display element. The inner wiring 210 may partially extend to the display area DA, or may be electrically connected to a conductive layer/wiring outside the display area DA.

The outer wiring 220 may be connected to a wiring disposed in a layer different from the layer of the outer wiring 220 in the non-display area NDA and/or the terminal unit 20 (see FIG. 1) of the non-display area NDA. Alternatively, one end of the outer wiring 220 may be exposed to the outside and connected to an electronic device, or the flexible film 60, etc. described with reference to FIG. 1.

The inner and outer wirings 210 and 220 spaced apart from each other with the bending area BA therebetween may be connected to the conductive layer 230. FIG. 3 illustrates a case where the conductive layer 230 is a bridge wiring which crosses the bending area BA and electrically connects the inner wiring 210 to the outer wiring 220. The conductive layer 230, which is a bridge wiring, may be disposed in the bending area BA and the first and second areas 1A and 2A adjacent to the bending area BA.

The conductive layer 230 is disposed in a layer different from the layer including the inner and outer wirings 210 and 220 with the interlayer insulating layer 130 therebetween. A portion of the conductive layer 230 corresponding to the bending area BA may be disposed on the organic layer 160, and a portion of the conductive layer 230 corresponding to the first and second areas 1A and 2A may be disposed in an organic through hole 160h of the organic layer 160.

The organic through hole 160h may at least partially overlap a first contact hole CNT1 of the interlayer insulating layer 130 and expose the first contact hole CNT1. Opposite ends of the conductive layer 230 are disposed to correspond to the organic through hole 160h in the first and second areas 1A and 2A, and may be connected to the inner and outer wirings 210 and 220 through the first contact hole CNT1. FIG. 3 illustrates a case where two first contact holes CNT1 are disposed inside one organic through hole 160h, however, the present invention is not limited thereto. For example, number of first contact holes CNT1 provided to the organic through hole 160h may differ.

FIG. 3 illustrates a display device in an un-bent configuration, for convenience of description, the substrate 100, etc. of the display device according to the present disclosure may be bent in the bending area BA as illustrated in FIG. 2. For example, as illustrated in FIG. 3, the display device is manufactured while the substrate 100 is approximately flat, and after that the display device is so-manufactured, the substrate 100 is bent in the bending area BA and may have the shape illustrated in FIG. 2. While the substrate 100, etc. are bent in the bending area BA, tensile stress may be applied to elements disposed inside the bending area BA.

To prevent a crack from occurring in the inorganic insulating layer IL due to the aforementioned tensile stress, an opening OP may be formed in a region of the inorganic insulating layer IL corresponding to the bending area BA. As illustrated in FIG. 3, in the case where the conductive layer 230 extends across the bending area BA, a crack may occur in the conductive layer 230 or a defect such as disconnection of the conductive layer 230 may occur during the bending process. To prevent this, the conductive layer 230 may include a material having relatively high elongation. Also, efficiency of electric signal transfer may be increased or a defect occurrence rate during a manufacturing process may be reduced in a display device by forming the inner and outer wirings 210 and 220 of the first and second areas 1A and 2A with materials having electric/physical properties different from those of the conductive layer 230.

For example, the inner and outer wirings 210 and 220 may include Mo, and the conductive layer 230 may include Al. The inner and outer wirings 210 and 220 and the conductive layer 230 may be a single layer or multiple layers. The conductive layer 230 may be a three-layer configuration of Ti/Al/Ti and may be multiple layers in which a thickness of Ti is 0.15 times the thickness of Al or less, for example, Ti has a thickness of 0.12 times the thickness of Al or less.

FIG. 3 illustrates a case where the inner and outer wirings 210 and 220 are formed during a process of forming the first and second gate electrodes G1 and G2, and may include the same material as that of the first and second gate electrodes G1 and G2. The conductive layer 230 may be formed during a process of forming the data line DL and may include the same material as that of the data line DL. Therefore, the inorganic protective layer PVX covering the data line DL may cover the conductive layer 230. In this case, a portion of the inorganic protective layer PVX corresponding to the bending area BA may be removed by an etching process, etc. Therefore, a problem which may occur in the case where the inorganic protective layer PVX remains (for example, a crack may occur in the inorganic protective layer PVX while the substrate 100, etc. are bent around the bending area BA, or the relevant crack propagates through the inorganic protective layer PVX and damages other layers, etc.) may be prevented or minimized.

A portion of the inorganic protective layer PVX corresponding to the bending area BA has been removed. The inorganic protective layer PVX may cover at least a portion of the conductive layer 230 in the first and second areas 1A and 2A. A distance "d" between an end of the inorganic protective layer PVX disposed in the first area 1A and an end of the inorganic protective layer PVX disposed in the second area 2A may be greater than the width of the bending area BA to prevent occurrence and propagation of the crack. The distance "d" between the ends of the inorganic protective layer PVX with the bending area BA therebetween may be substantially equal to, or greater than, the width OW of the opening OP of the inorganic insulating layer IL. However, the instant invention is not particularly limited to this configuration. For example, the distance "d" may be a little less than the width OW.

The inorganic protective layer PVX may cover a portion of the conductive layer 230 corresponding to the first contact hole CNT1 in the first area 1A. Referring to the enlarged portion of FIG. 3, the inorganic protective layer PVX may be disposed to correspond to a contact portion "ca" between the inner wiring 210 and the conductive layer 230, an inner wall 130s of the interlayer insulating layer 130 surrounding the first contact hole CNT1, and a portion of an upper surface 130u of the interlayer insulating layer 130 connected to the inner wall 130s. FIG. 3 illustrates that the inorganic protective layer PVX is disposed on the conductive layer 230 and covers not only a portion of the conductive layer 230 corresponding to the first contact hole CNT1 but also other portions thereof.

Similarly, the inorganic protective layer PVX may cover a portion of the conductive layer 230 corresponding to the first contact hole CNT1 in the second area 2A. The inorganic protective layer PVX may be disposed to correspond to a contact portion between the outer wiring 220 and the conductive layer 230, an inner wall of the interlayer insulating layer 130 surrounding the first contact hole CNT1, and a portion of an upper surface of the interlayer insulating layer 130 connected to the inner wall. FIG. 3 illustrates that the inorganic protective layer PVX is disposed on the conductive layer 230 and covers not only a portion of the conductive layer 230 corresponding to the first contact hole CNT1 but also other portions thereof.

In the case where the inorganic protective layer PVX does not cover at least a portion of the conductive layer 230 and is removed, for example, during an etching process of completely removing the inorganic protective layer PVX in the bending area BA, and the first and second areas 1A and 2A of the non-display area NDA and a subsequent process, damage and/or fine cracks may easily occur on an upper portion of the conductive layer 230. Damage and/or fine cracks may tend to occur at a step difference around the first contact hole CNT1 which is relatively fragile. Moisture transmission may occur through damage and/or a fine crack, and metal oxide (e.g. AlOx) is generated around the step difference in the vicinity of the first contact hole CNT1 and reduces a resistance of the conductive layer 230, and the inner and outer wirings 210 and 220 may be disconnected around the metal oxide. However, according to exemplary embodiments of the present invention, since the inorganic protective layer PVX covers at least a portion of the conductive layer 230 corresponding to the first contact hole CNT1, occurrence of the damage and/or fine cracks, moisture transmission, etc. may be prevented.

A protective layer 600 may be disposed on the conductive layer 230. Though the first and second planarization insulating layers 141 and 142, and the pixel-defining layer 150 in the display area DA may extend to the non-display area NDA and form the protective layer 600 covering the conductive layer 230. However, the invention is not limited to this particular configuration. For example, the protective layer 600 covering the conductive layer 230 in the non-display area NDA may include at least one of the first and second planarization insulating layers 141 and 142 and the pixel-defining layer 150, or may be formed during a separate process (e.g. coating and curing a material in liquid or paste form) by using an organic material different from those of the first and second planarization insulating layers 141 and 142 and the pixel-defining layer 150.

Figure 4:
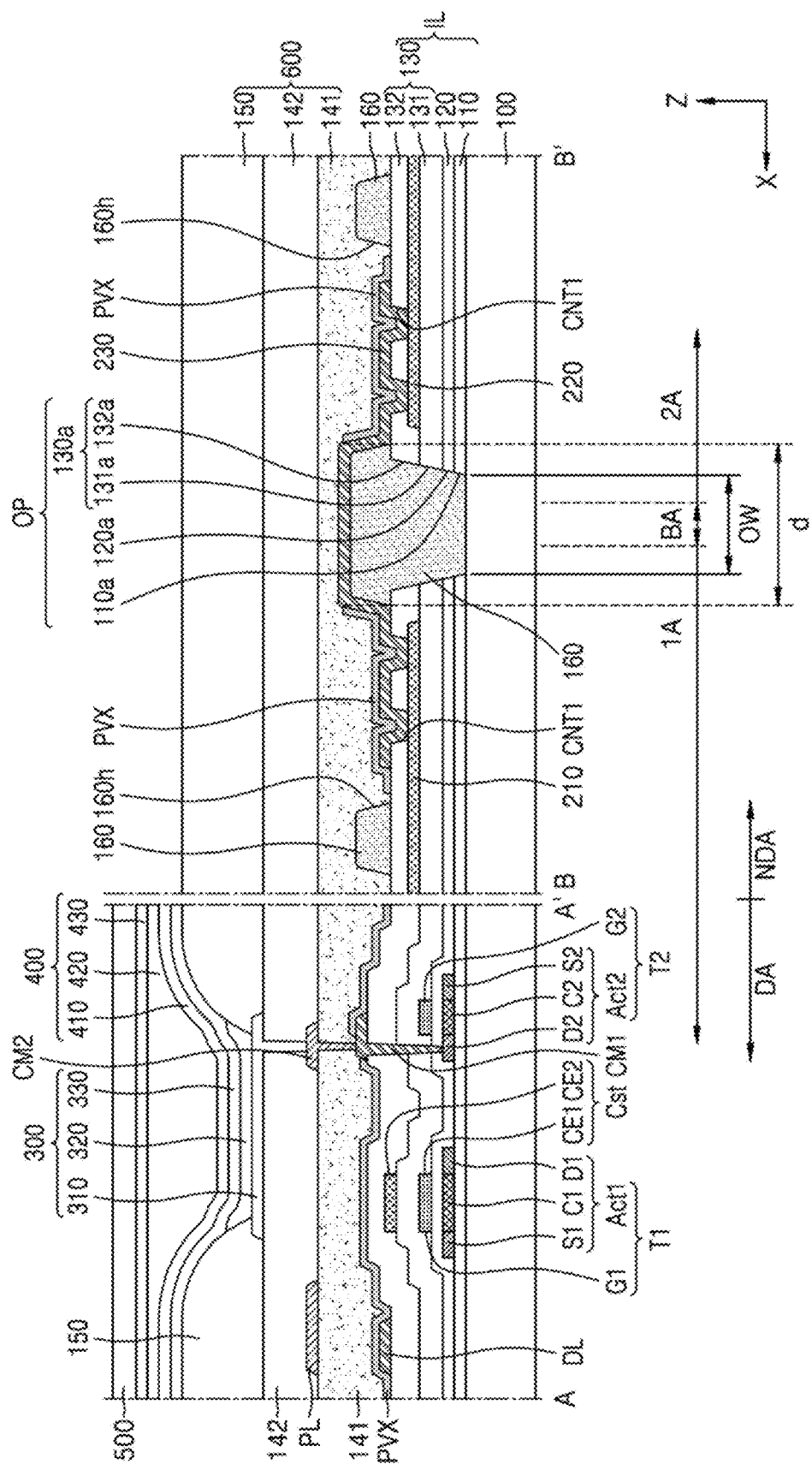
FIG. 4 is a cross-sectional view illustrating a display device according to an exemplary embodiment of the present invention.

FIG. 4 is a cross-sectional view of a display device according to an exemplary embodiment of the present invention. In FIG. 4, same reference numerals as those of the configuration of FIG. 3 represent the same members. Differences are mainly described below.

Referring to FIG. 4, the inner and outer wirings 210 and 220 are simultaneously formed during a process of forming the second storage capacitor plate CE2 of the storage capacitor Cst, and may include the same material as that of the second storage capacitor plate CE2. For example, the inner and outer wirings 210 and 220, and the second storage capacitor plate CE2 may include Mo.

The inner and outer wirings 210 and 220 may contact the conductive layer 230 via the first contact hole CNT1, and at least a portion of the upper surface of the conductive layer 230 may be covered by the inorganic protective layer PVX as described above.

FIGS. 3 and 4 illustrate the driving voltage line PL is disposed on the first planarization insulating layer 141 and is covered by the second planarization insulating layer 142, however, the present invention is not limited to this particular configuration. For example, the driving voltage line PL may be formed in the same layer as that of the data line DL during the same process. In this case, the second planarization insulating layer 142 may be omitted, and the pixel electrode 310 may be connected to the second TFT T2 through the first connection metal CM1.

FIGS. 3 and 4 illustrate that the inner wiring 210 and the outer wiring 220 are disposed in the same layer, however, the present invention is not limited thereto. For example, the inner wiring 210 may be disposed on the gate insulating layer 120 as illustrated in FIG. 3, and the outer wiring 220 may be disposed on the first interlayer insulating layer 131 as illustrated in FIG. 4. Alternatively, the inner wiring 210 may be disposed on the first interlayer insulating layer 131 as illustrated in FIG. 4, and the outer wiring 220 may be disposed on the gate insulating layer 120 as illustrated in FIG. 3.

Figure 5:
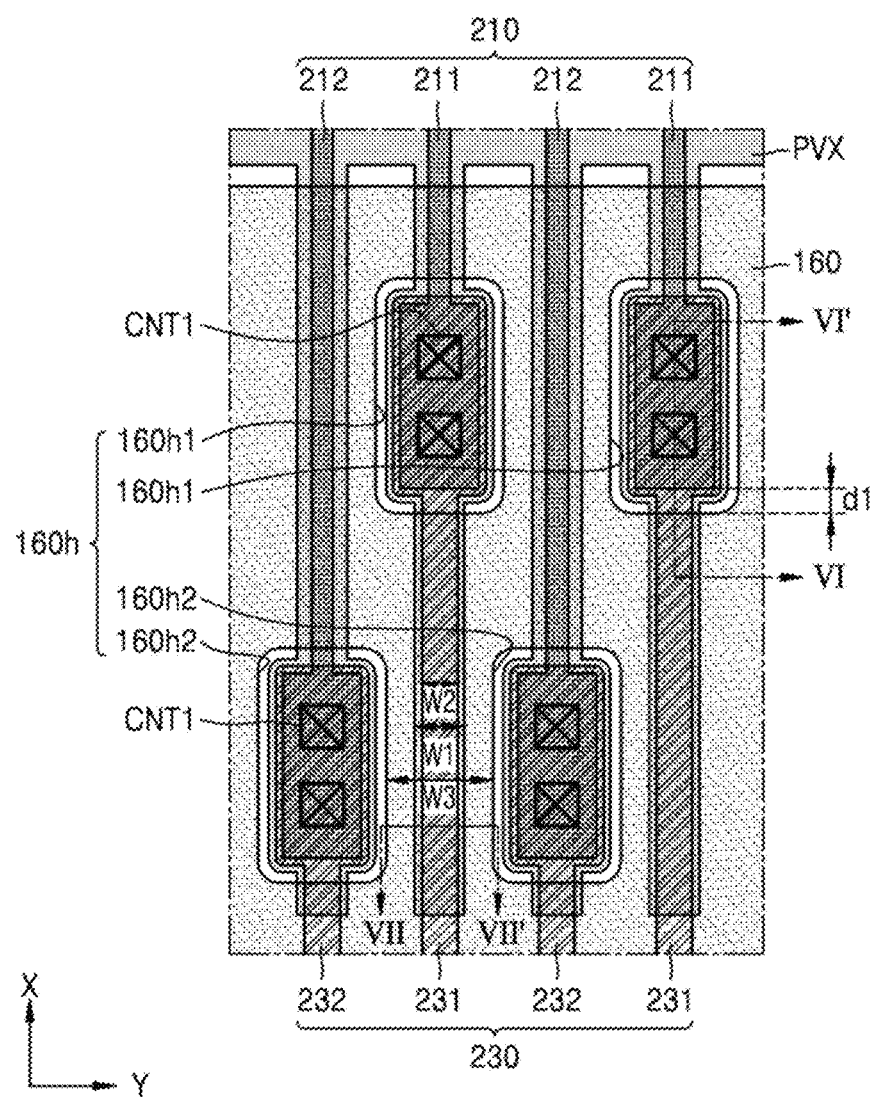
FIG. 5 is a plan view illustrating a portion of a wiring unit of a display device according to an exemplary embodiment of the present invention.
Figure 6:
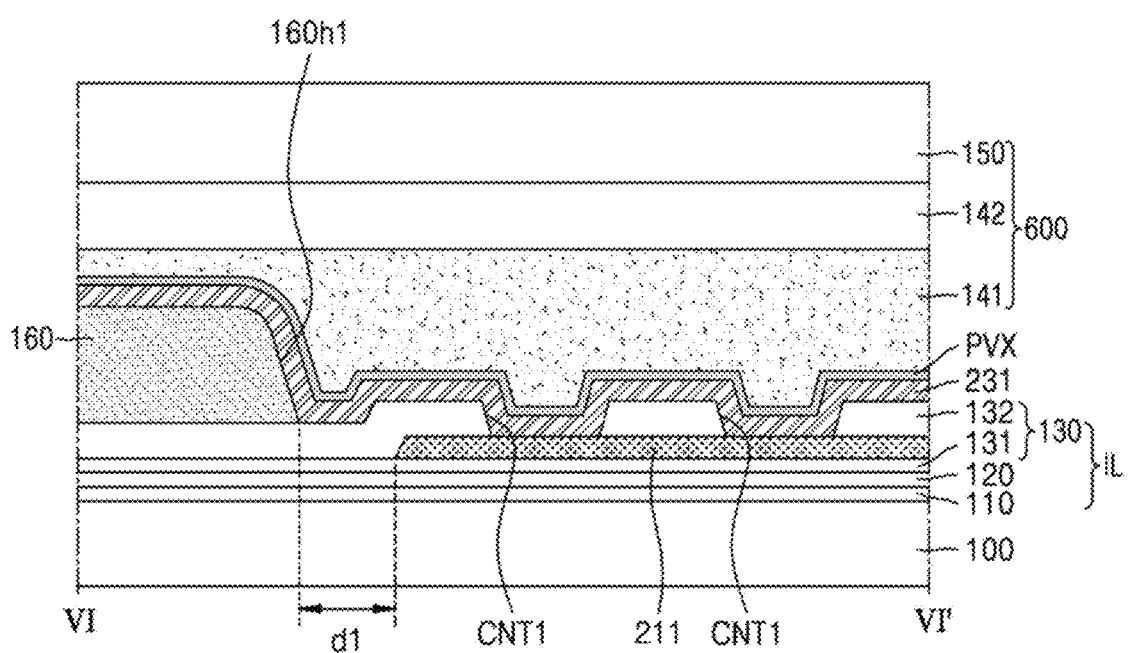
FIG. 6 is a cross-sectional view illustrating the wiring unit taken along a line VI-VI' of FIG. 5.
Figure 7:
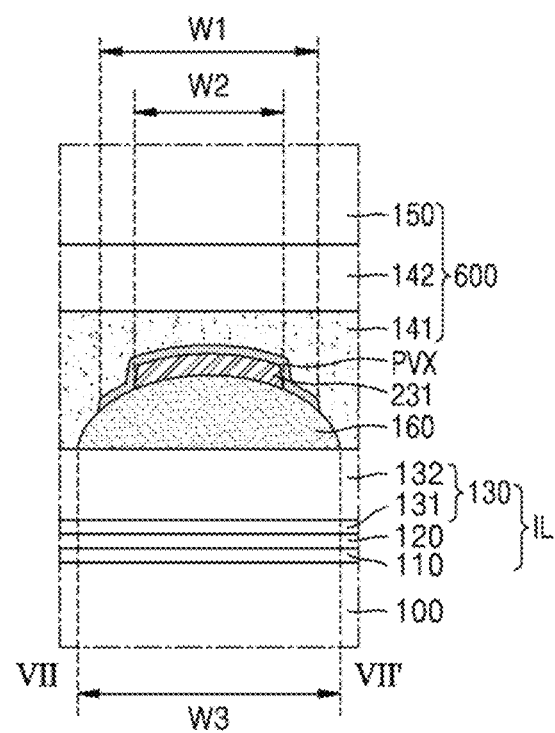
FIG. 7 is a cross-sectional view illustrating the wiring unit taken along a line VII-VII' of FIG. 5.

FIG. 5 is a plan view of a portion of a wiring unit of a display device according to an exemplary embodiment of the present invention, and may correspond to a portion V of FIG. 1. FIG. 6 is a cross-sectional view of the wiring unit taken along a line VI-VI' of FIG. 5, and FIG. 7 is a cross-sectional view of the wiring unit taken along a line VII-VII' of FIG. 5.

Referring to FIG. 5, the inner wirings 210 may extend in an X-direction and may be spaced apart from each other in a Y-direction. Hereinafter, for convenience of description, some of the inner wirings 210 is referred to as a first inner wiring 211, and the rest of the inner wirings 210 is referred to as a second inner wiring 212. A conductive layer of the conductive layers 230 contacting the first inner wiring 211 is referred to as a first conductive layer 231, and a conductive layer of the conductive layers 230 contacting the second inner wiring 212 is referred to as a second conductive layer 232. Also, a through hole of the organic through holes 160h corresponding to a contact of the first inner wiring 211 and the first conductive layer 231 is referred to as a first organic through hole 160h, and a through hole of the organic through holes 160h corresponding to a contact of the second inner wiring 212 and the second conductive layer 232 is referred to as a second organic through hole 160h2. As described above with reference to FIGS. 3 and 4, the first and second conductive layers 231 and 232 illustrated in FIG. 5 may be bridge wirings extending across the bending area BA and electrically connecting the inner wiring 210 to the outer wiring 220.

A contact region of the first inner wiring 211 and the first conductive layer 231, and a contact region of the second inner wiring 212 and the second conductive layer 232 may be alternately disposed. For example, the contact region of the first inner wiring 211 and the first conductive layer 231, and the contact region of the second inner wiring 212 and the second conductive layer 232 may be alternately disposed in a zigzag form. Therefore, a distance between the first inner wiring 211 and the second inner wiring 212 may be reduced and so space may be used more efficiently.

The organic layer 160 at least partially overlaps the first and second inner wirings 211 and 212 and the first and second conductive layers 231 and 232, and includes the first and second organic through holes 160$h$1 and 160$h$2 for providing contact between the first inner wiring 211 and the first conductive layer 231, and between the second inner wiring 212 and the second conductive layer 232. The first organic through hole 160$h$1 corresponds to an overlapping portion of the first inner wiring 211 and the first conductive layer 231, and the second organic through hole 160$h$2 corresponds to an overlapping portion of the second inner wiring 212 and the second conductive layer 232. The first and second organic through holes 160$h$1 and 160$h$2 may be shifted and disposed in a zigzag form.

The inorganic protective layer PVX may correspond to the first and second organic through holes 160$h$1 and 160$h$2. The inorganic protective layer PVX may cover the contact regions of the first and second inner wirings 211 and 212, and the first and second conductive layers 231 and 232. According to an exemplary embodiment of the present disclosure, the inorganic protective layer PVX may partially overlap the organic layer 160. For example, the inorganic protective layer PVX may overlap at least a portion of the first and second inner wirings 211 and 212 and the first and second conductive layers 231 and 232.

Referring to FIGS. 5 and 6, the interlayer insulating layer 130 including the first contact hole CNT1, for example, the second interlayer insulating layer 132 is disposed on the first inner wiring 211. The organic layer 160 may be disposed on the interlayer insulating layer 130 and may include the first organic through hole 160$h$1 formed by removing a portion of the organic layer 160 corresponding to the first contact hole CNT1. A portion of the first conductive layer 231 corresponding to the first organic through hole 160$h$1 may be connected to the first inner wiring 211 through the first contact hole CNT1.

Likewise, the second interlayer insulating layer 132 including the first contact hole CNT1 is disposed on the second inner wiring 212. The organic layer 160 may be disposed on the interlayer insulating layer 130 and may include the second organic through hole 160$h$2 formed by removing a portion of the organic layer 160 corresponding to the first contact hole CNT1. A portion of the second conductive layer 232 corresponding to the second organic through hole 160$h$2 may be connected to the second inner wiring 212 through the first contact hole CNT1

The first organic through hole 160$h$1 may be spaced apart by a preset interval from an end of the first inner wiring 211. For example, a spaced distance between a lower end of the first organic through hole 160$h$1 and an end of the first inner wiring 211 may be about 4 μm to about 8 μm. Similarly, a lower end of the second organic through hole 160$h$2 may be spaced apart by the above distance from an end of the second inner wiring 212.

The inorganic protective layer PVX may cover a portion of the first conductive layer 231 and a portion of the second conductive layer 232 corresponding to the first contact hole CNT1. Therefore, damage and/or a fine crack occurrence of the first and second conductive layers 231 and 232 and moisture transmission may be prevented as described above with reference to FIG. 3.

Referring to FIGS. 5 and 7, the inorganic protective layer PVX may extend to cover the first conductive layer 231 on the organic layer 160, and a width W1 in the Y-direction (or a direction crossing an extension direction of the first conductive layer) may be greater than a width W2 of the first conductive layer 231. Opposite edges of the inorganic protective layer PVX in the Y-direction may contact an upper surface of the organic layer 160.

Since the width W1 of the inorganic protective layer PVX is less than a width W3 of the organic layer 160 as illustrated in FIG. 7, a portion of the upper surface of the organic layer 160 may be exposed to the outside. The portion of the upper surface of the organic layer 160 not covered by the inorganic protective layer PVX may be an out-gassing path through which a material included in the organic layer 160 evaporates and is externally discharged during a curing process of the organic layer 160 in a manufacturing process of a display device.

FIG. 5 illustrates a case where the first and second inner wirings 211 and 212 are formed during the same process as the second storage capacitor plate CE2 and include the same material as that of the second storage capacitor plate CE2. Here, the first and second conductive layers 231 and 232 are formed during the same process as the data line DL and include the same material as that of the data line DL, as described above with reference to FIG. 4. However, the present invention is not limited to this particular configuration. For example, the first and second inner wirings 211 and 212 may be formed during the same process as the first and second gate electrodes G1 and G2 and/or the first storage capacitor plate CE1 and include the same material as that of the first and second gate electrodes G1 and G2 and/or the first storage capacitor plate CE1 as described above with reference to FIG. 3.

FIGS. 5 to 7 describe a structure in which the inner wiring 210 is connected to the conductive layer 230. However, such a structure is equally applicable to a connection structure of the outer wiring 220 and the conductive layer 230 described with reference to FIGS. 3 and 4.

Figure 8:
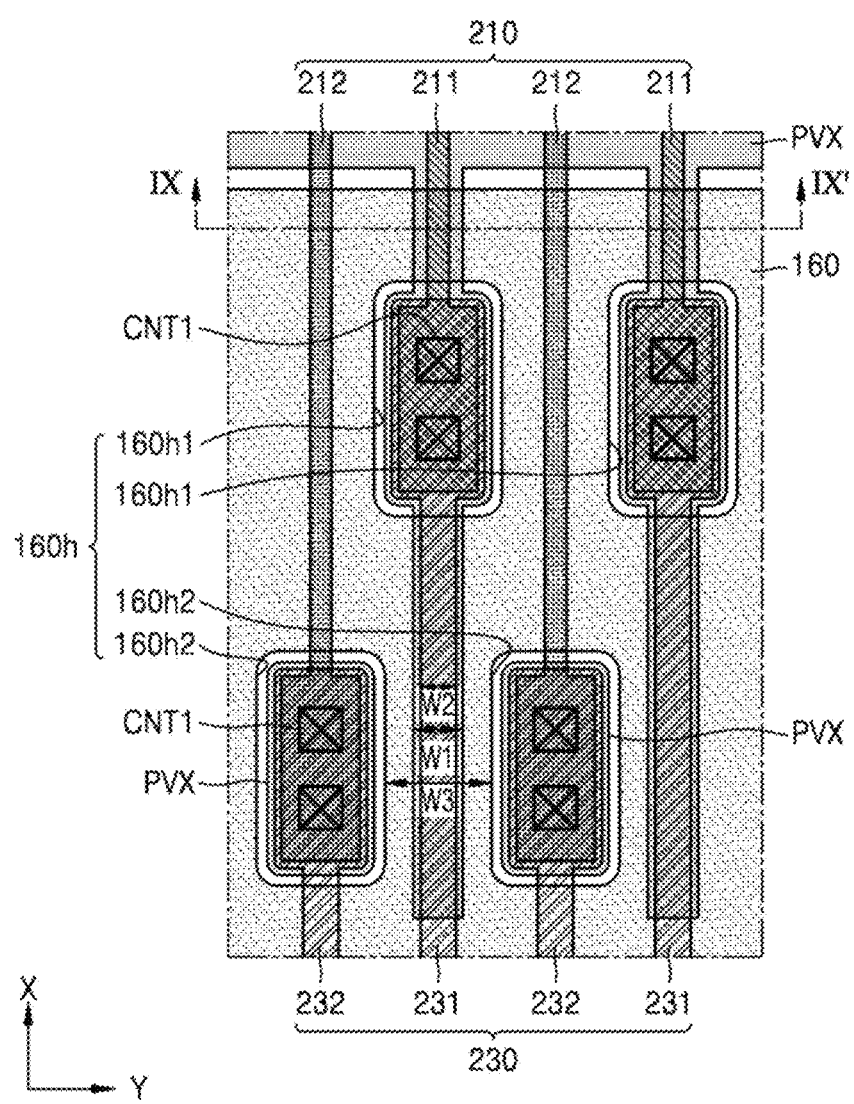
FIG. 8 is a plan view illustrating a portion of a wiring unit of a display device according to an exemplary embodiment of the present invention.
Figure 9:
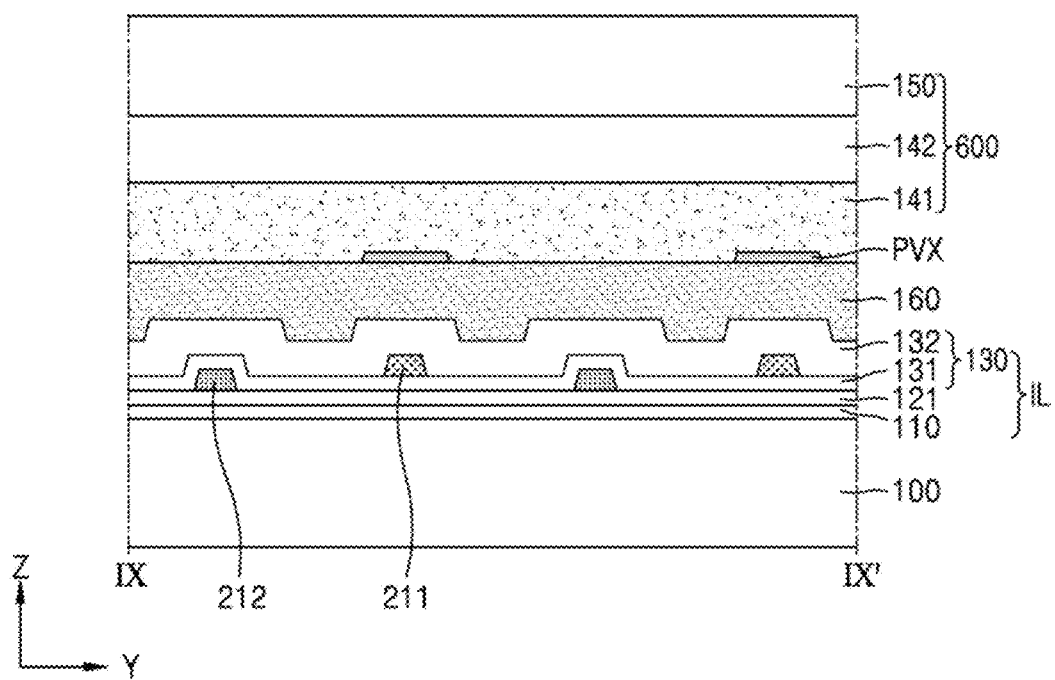
FIG. 9 is a cross-sectional view illustrating the wiring unit taken along a line IX-IX' of FIG. 8.

FIG. 8 is a plan view illustrating a portion of a wiring unit of a display device according to an exemplary embodiment of the present invention, and FIG. 9 is a cross-sectional view of the wiring unit taken along a line IX-IX' of FIG. 8. The arrangement of the first and second inner wirings 211 and 212 and the arrangement of the inorganic protective layer PVX of the display device of FIGS. 8 and 9 are different from that described above with reference to FIGS. 5 to 7. In FIGS. 8 and 9, same reference numerals as those of FIG. 5 may represent the same or similar elements. For convenience of description, differences between corresponding elements are mainly described below, and it may be assumed that other details are at least similar to those of corresponding elements that have already been described.

Referring to FIGS. 8 and 9, the first and second inner wirings 211 and 212 may be respectively disposed in different layers. For example, the first inner wiring 211 may be disposed between the first interlayer insulating layer 131 and the second interlayer insulating layer 132 and may include the same material as that of the second storage capacitor plate CE2 (see FIGS. 3 and 4). The second inner wiring 212 may be disposed between the first interlayer insulating layer 131 and the gate insulating layer 120 and may include the same material as that of the first and second gate electrodes G1 and G2 (see FIGS. 3 and 4) and/or the first storage capacitor plate CE1 (see FIGS. 3 and 4). In the case where the first and second inner wirings 211 and 212 respectively and alternately disposed in different layers, a distance between the first and second inner wirings 211 and 212 may be further reduced.

The inorganic protective layer PVX may cover the contact region of the first inner wiring 211 and the first conductive layer 231 and the contact region of the second inner wiring 212 and the second conductive layer 232 and so prevent damage and/or a fine crack from occurring in the first and second conductive layers 231 and 232 at a step difference around the first contact hole CNT1 as described above.

The inorganic protective layer PVX may at least partially overlap to cover one of the first and second inner wirings 211 and 212, and may at least partially overlap to cover one of the first and second conductive layers 231 and 232. FIG. 8 illustrates a case where the inorganic protective layer PVX at least partially overlaps a portion of the first inner wiring 211 and the first conductive layer 231. A relation between the width W1 of the inorganic protective layer PVX overlapping the first conductive layer 231, the width W3 of a portion of the organic layer 160, and the width W2 of the first conductive layer 231 is the same as the relation described above with reference to FIG. 7.

The second inner wiring 212 is covered by the first and second interlayer insulating layers 131 and 132 among the inorganic insulating layers IL. On the contrary, the first inner wiring 211 is covered by only the second interlayer insulating layer 132. To complement a passivation function, which may be relatively insufficient, the inorganic protective layer PVX may at least partially overlap the first inner wiring 211 among the first and second inner wirings 211 and 212 as illustrated in FIG. 8.

According to an exemplary embodiment of the present invention, the inorganic protective layer PVX might not overlap the first and second inner wirings 211 and 212. When the area of the inorganic protective layer PVX covering the organic layer 160 increases, a gas which is not discharged and remains during the curing process of the organic layer 160 may transform the organic layer 160 or layers on the organic layer 160. Therefore, if a passivation function is sufficiently secured with only the second interlayer insulating layer 132, the inorganic protective layer PVX may cover only a portion corresponding to contact regions of the first and second inner wirings 211 and 212 and the first and second conductive layers 231 and 232, and might not cover the first and second inner wirings 211 and 212.

FIGS. 8 and 9 illustrate a case where the first inner wiring 211 is disposed between the first interlayer insulating layer 131 and the second interlayer insulating layer 132, and the second inner wiring 212 is disposed between the first interlayer insulating layer 131 and the gate insulating layer 120. However, the present invention is not limited thereto. For example, the first inner wiring 211 may be disposed between the first interlayer insulating layer 131 and the gate insulating layer 120 and may include the same material as that of the first and second gate electrodes G1 and G2 and/or the first storage capacitor plate CE1. Also, the second inner wiring 212 may be disposed between the first interlayer insulating layer 131 and the second interlayer insulating layer 132 and may include the same material as that of the second storage capacitor plate CE2 (see FIGS. 3 and 4).

Though FIGS. 8 and 9 illustrate a structure in which the inner wiring 210 is connected to the conductive layer 230, such a structure is equally applicable to a connection structure of the outer wiring 220 and the conductive layer 230 described above with reference to FIGS. 3 and 4.

Figure 10:
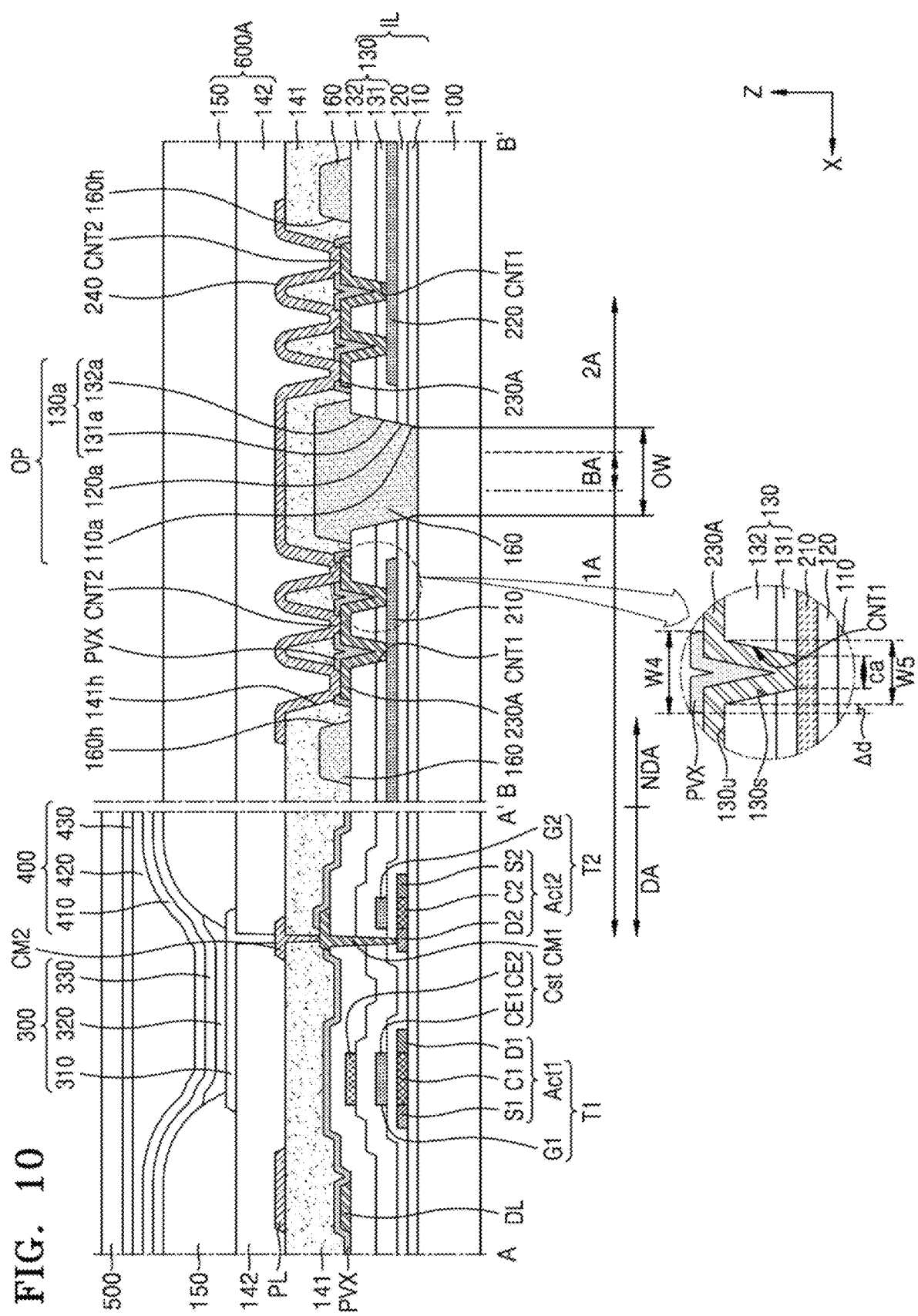
FIG. 10 is a cross-sectional view illustrating a display device according to an exemplary embodiment of the present invention.

FIG. 10 is a cross-sectional view of a display device according to an exemplary embodiment of the present invention. In FIG. 10, same reference numerals as those described above with respect to FIG. 3 may represent the same or similar elements. It may be assumed that to the extent that details are not provided, those details may be the same as or similar to details described elsewhere in the disclosure.

Referring to FIG. 10, the inner wiring 210 disposed in the first area 1A may be connected to a conductive layer 230A through the first contact hole CNT1 formed in the interlayer insulating layer 130, and the outer wiring 220 disposed in the second area 2A may be connected to the conductive layer 230A through the contact hole CNT1 formed in the interlayer insulating layer 130.

The conductive layer 230A is disposed in a layer different from the layer in which the inner and outer wirings 210 and 220 are disposed. The inner and outer wirings 210 and 220 are disposed under the interlayer insulating layer 130, and the conductive layer 230A may be disposed on the interlayer insulating layer 130. The inner and outer wirings 210 and 220 may be formed during the same process as the first and second gate electrodes G1 and G2 and/or the first storage capacitor plate CE1, and may include the same material as that of the first and second gate electrodes G1 and G2 and/or the first storage capacitor plate CE1. The conductive layer 230A may be formed during a process of forming the data line DL and may include the same material as that of the data line DL.

The conductive layer 230A is an island type layer and may be disposed in the first and second areas 1A and 2A. The conductive layer 230 described with reference to FIG. 3 is a bridge wiring crossing the bending area BA, but the conductive layer 230A of FIG. 10 may correspond to an island electrode layer. The conductive layer 230A may correspond to the organic through hole 160h.

The organic through hole 160h may at least partially overlap the first contact hole CNT1 of the interlayer insulating layer 130 and may expose the first contact hole CNT1. The conductive layers 230A may correspond to the organic through holes 160h in the first and second areas 1A and 2A, and may be respectively connected to the inner and outer wirings 210 and 220 through the first contact holes CNT1.

The inorganic protective layer PVX may cover a portion of the conductive layer 230A corresponding to the first contact hole CNT1. Referring to an enlarged portion of FIG. 10, the inorganic protective layer PVX may correspond to a contact portion "ca" of the inner wiring 210 and the conductive layer 230A, the inner wall 130s of the interlayer insulating layer 130 surrounding the first contact hole CNT1, and a portion of the upper surface 130u of the interlayer insulating layer 130 connected to the inner wall 130s. A width W4 of the inorganic protective layer PVX overlapping the first contact hole CNT1 may be greater than a width W5 of an upper portion of the first contact hole CNT1. As described above, since the inorganic protective layer PVX covers a step difference around the first contact hole CNT1, problems such as occurrence of damage and/or a fine crack in the conductive layer 230A at the step difference, generation of a metal oxide (e.g. AlOx) around the step difference due to generation of moisture transmission, or reduction in a resistance of the conductive layer 230 may be prevented. The inorganic protective layer PVX, the first contact hole CNT1, and a structure of surroundings thereof illustrated in FIG. 10 are equally applicable to the first contact hole CNT1 of the outer wiring 220 and surroundings thereof.

An additional conductive layer 240 may electrically connect the inner wiring 210 of the first area 1A to the outer wiring 220 of the second area 2A. The additional conductive layer 240 may be a bridge wiring extending across the bending area BA and electrically connecting the inner and outer wirings 210 and 220.

The additional conductive layer 240 may include a material having electric/physical properties different from those of the inner and outer wirings 210 and 220. For example, the inner and outer wirings 210 and 220 may include Mo, and the additional conductive layer 240 may include Al. The additional conductive layer 240 may be a single layer or multiple layers. In an exemplary embodiment of the present invention, the additional conductive layer 240 may be a three-layer arrangement of Ti/Al/Ti and may be multiple layers in which a thickness of Ti is 0.15 times the thickness of Al or less, for example, Ti has a thickness of 0.12 times the thickness of Al or less, but the present invention is not limited to this particular configuration.

The additional conductive layer 240 may be connected to the conductive layer 230A through the second contact hole CNT2 passing through the inorganic protective layer PVX. The inner and outer wirings 210 and 220 may respectively contact the conductive layer 230A through the first contact holes CNT1 of the interlayer insulating layer 130, and the additional conductive layer 240 may contact the conductive layer 230A through the second contact hole CNT2 of the inorganic protective layer PVX, and so the inner and outer wirings 210 and 220 may be electrically connected.

Since the inorganic protective layer PVX should cover a portion of the conductive layer 230A corresponding to the first contact hole CNT1 in order to prevent occurrence of damage and/or a fine crack as described above, the second contact hole CNT2 for providing contact between the conductive layer 230A and the additional conductive layer 240 may be spaced apart by a preset interval Δd such that the second contact hole CNT2 does not overlap the first contact hole CNT1.

The first planarization insulating layer 141, which is an organic insulating layer, may be disposed under the additional conductive layer 240. For example, the first planarization insulating layer 141 of the display area DA may extend to the non-display area NDA and may be disposed under the additional conductive layer 240. The first planarization insulating layer 141 may include a hole 141h at least partially overlapping the second contact hole CNT2 of the inorganic protective layer PVX. FIG. 10 illustrates a case where a plurality of holes 141h of the first planarization insulating layer 141 are disposed inside the organic through hole 160h of the organic layer 160.

A protective layer 600A may be disposed on the additional conductive layer 240. Though the second planarization insulating layer 142 and the pixel-defining layer 150 may extend to the non-display area NDA and form the protective layer 600A, the present invention is not limited to this particular arrangement. For example, the protective layer 600A covering the additional conductive layer 240 in the non-display area NDA may include either the second planarization insulating layer 142 or the pixel-defining layer 150, or the protective layer 600A may be formed during a separate process (e.g. coating and curing a material in liquid or paste form) by using an organic material different from those of the second planarization insulating layer 142 and the pixel-defining layer 150.

Figure 11:
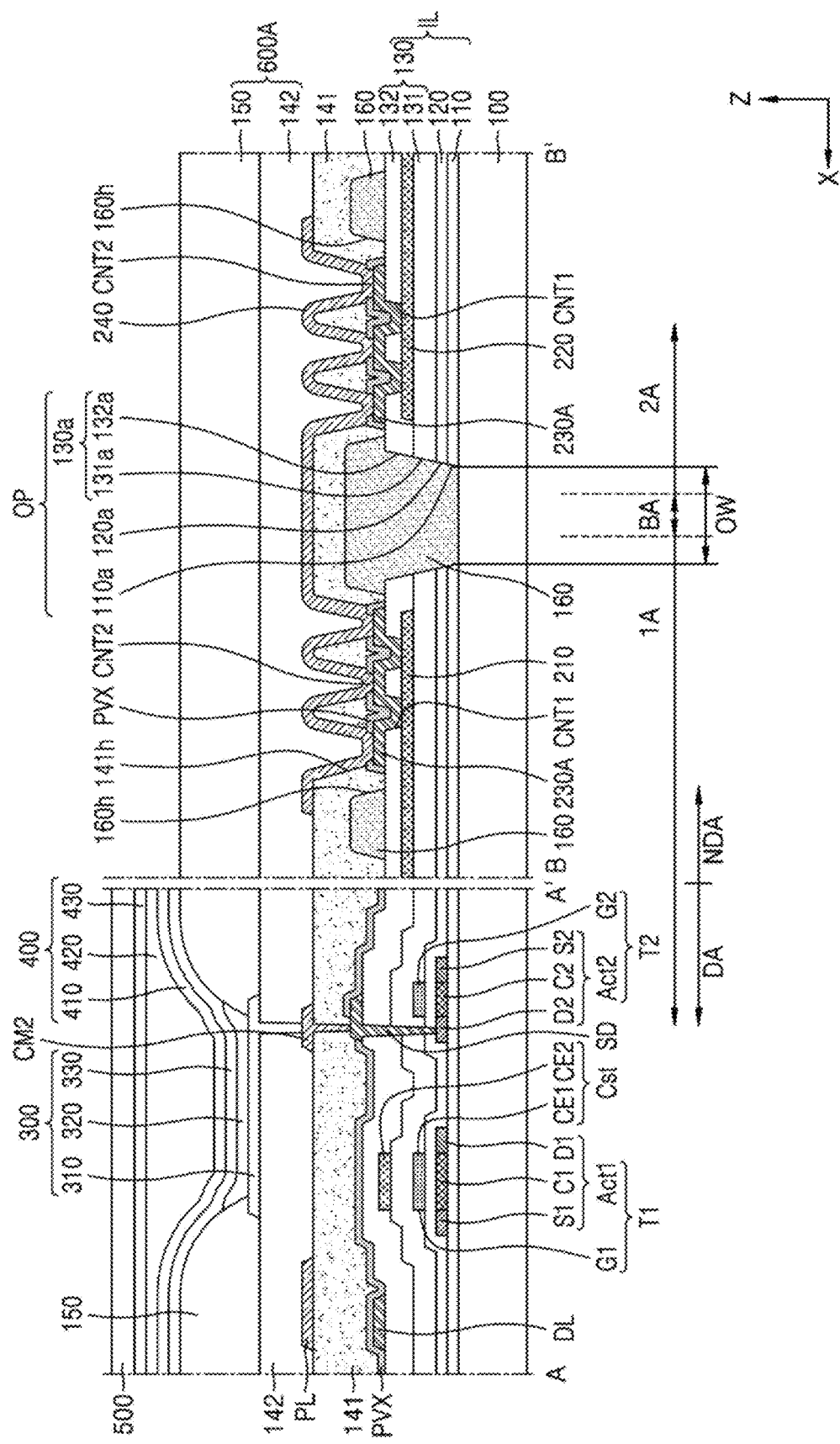
FIG. 11 is a cross-sectional view illustrating a display device according to an exemplary embodiment of the present invention.

FIG. 11 is a cross-sectional view of a display device according to an exemplary embodiment of the present invention. In FIG. 11, same reference numerals as those described with reference to FIG. 10 may represent corresponding elements here and any omitted details may be assumed to be at least similar to details of corresponding elements described elsewhere in the specification.

Referring to FIG. 11, the inner and outer wirings 210 and 220 are simultaneously formed during a process of forming the second storage capacitor plate CE2 of the storage capacitor Cst, and may include the same material as that of the second storage capacitor plate CE2. For example, the inner and outer wirings 210 and 220, and the second storage capacitor plate CE2 may include Mo.

The inner and outer wirings 210 and 220 may be connected to the conductive layer 230A through the first contact hole CNT1, at least a portion of the upper surface of the conductive layer 230A may be covered by the inorganic protective layer PVX, and the additional conductive layer 240 may be connected to the conductive layer 230A through the second contact hole CNT2 as described above.

Though FIGS. 10 and 11 illustrate that the inner wiring 210 and the outer wiring 220 are disposed in the same layer, the present invention is not limited to this particular arrangement. For example, the inner wiring 210 may be disposed on the gate insulating layer 120 as illustrated in FIG. 10, and the outer wiring 220 may be disposed on the first interlayer insulating layer 131 as illustrated in FIG. 11. Alternatively, the inner wiring 210 may be disposed on the first interlayer insulating layer 131 as illustrated in FIG. 11, and the outer wiring 220 may be disposed on the gate insulating layer 120 as illustrated in FIG. 10.

Figure 12:
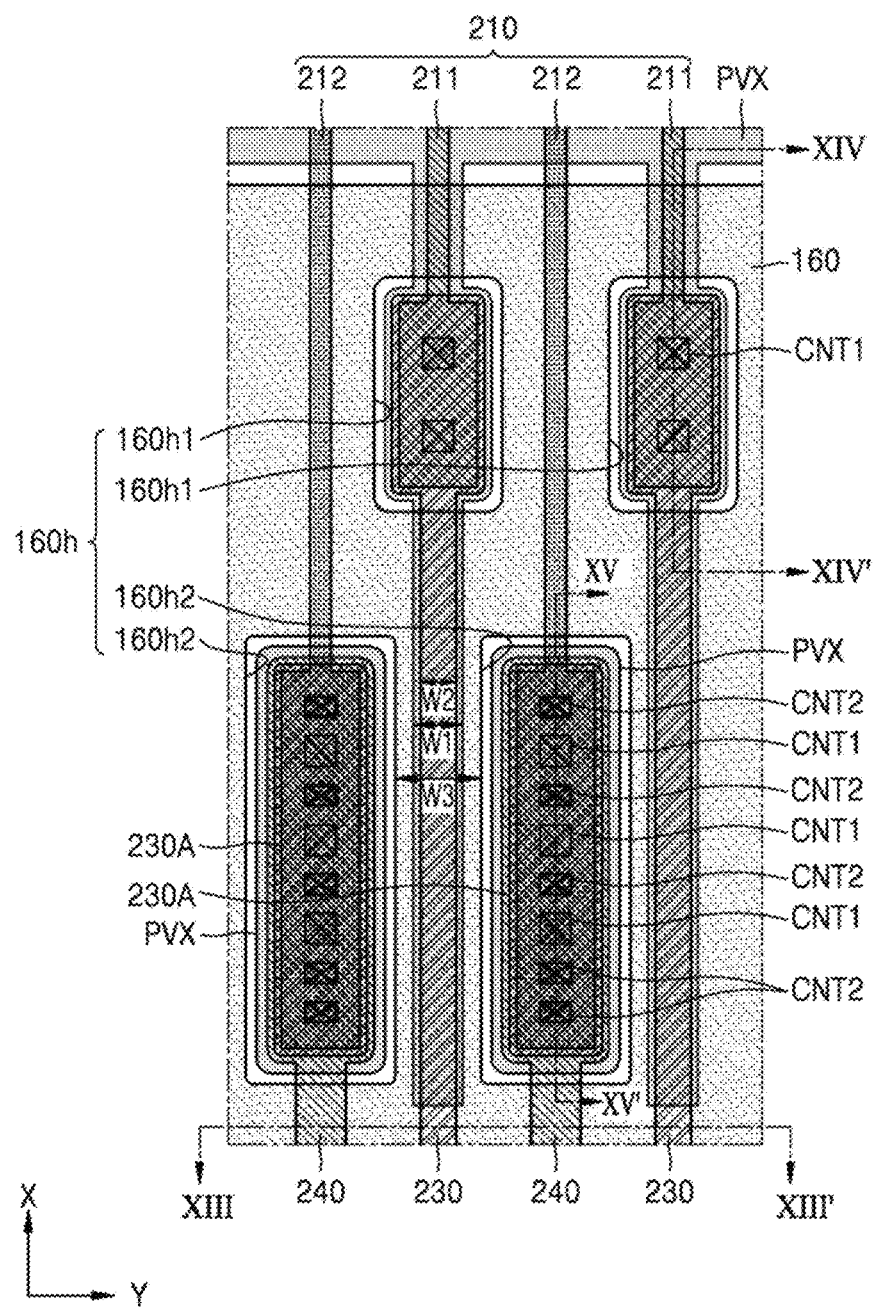
FIG. 12 is a plan view illustrating a portion of a wiring unit of a display device according to an exemplary embodiment of the present invention.
Figure 13:
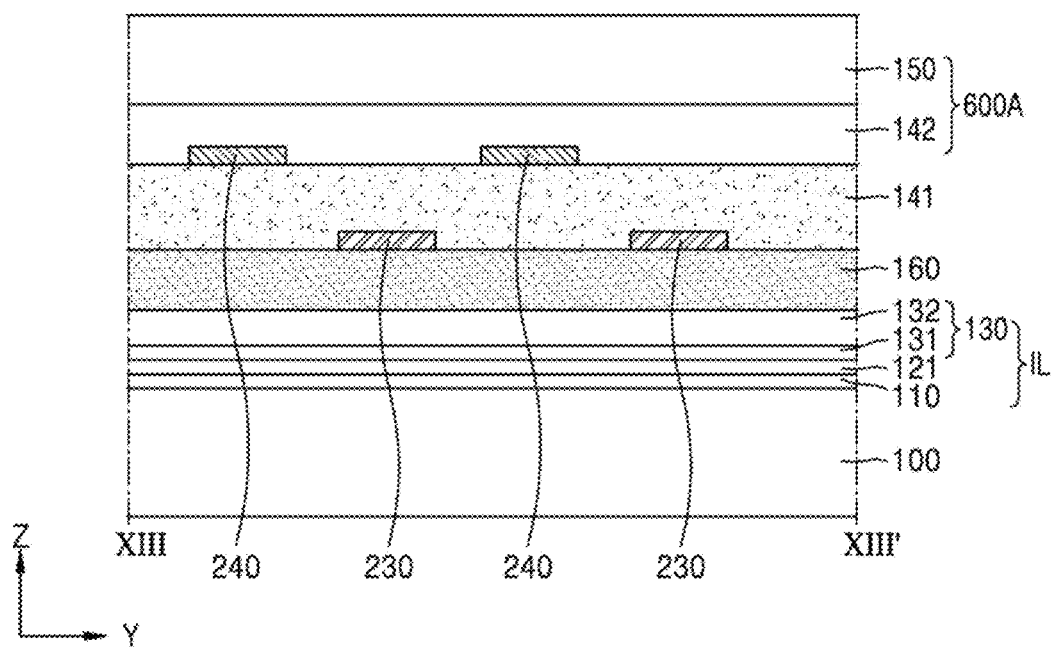
FIG. 13 is a cross-sectional view illustrating the wiring unit taken along a line XIII-XIII' of FIG. 12.
Figure 14:
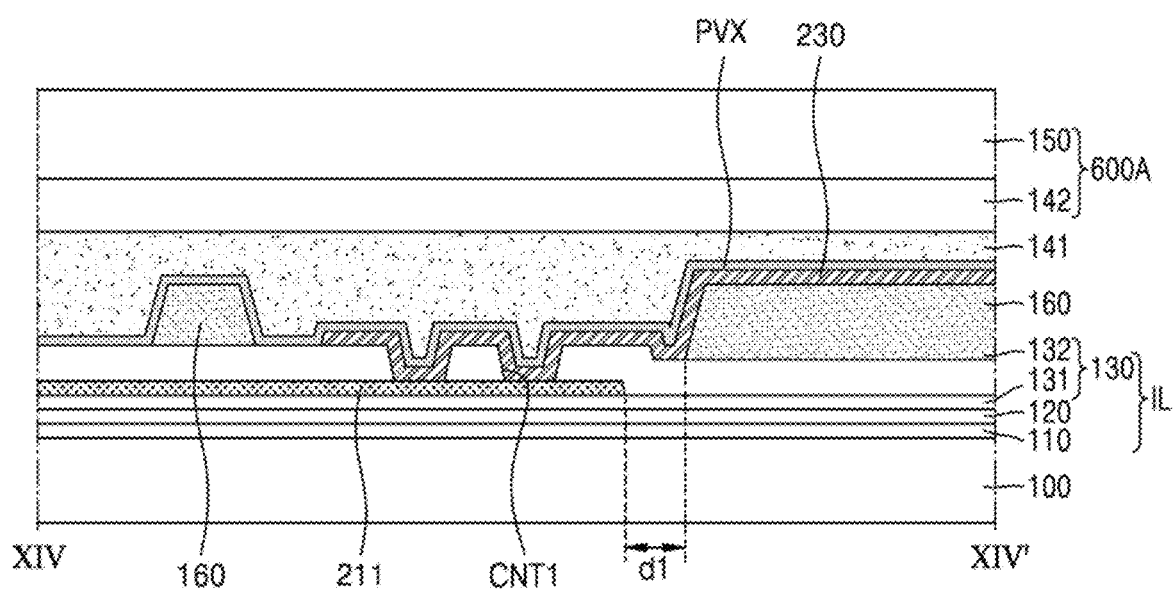
FIG. 14 is a cross-sectional view illustrating the wiring unit taken along a line XIV-XIV' of FIG. 12.
Figure 15:
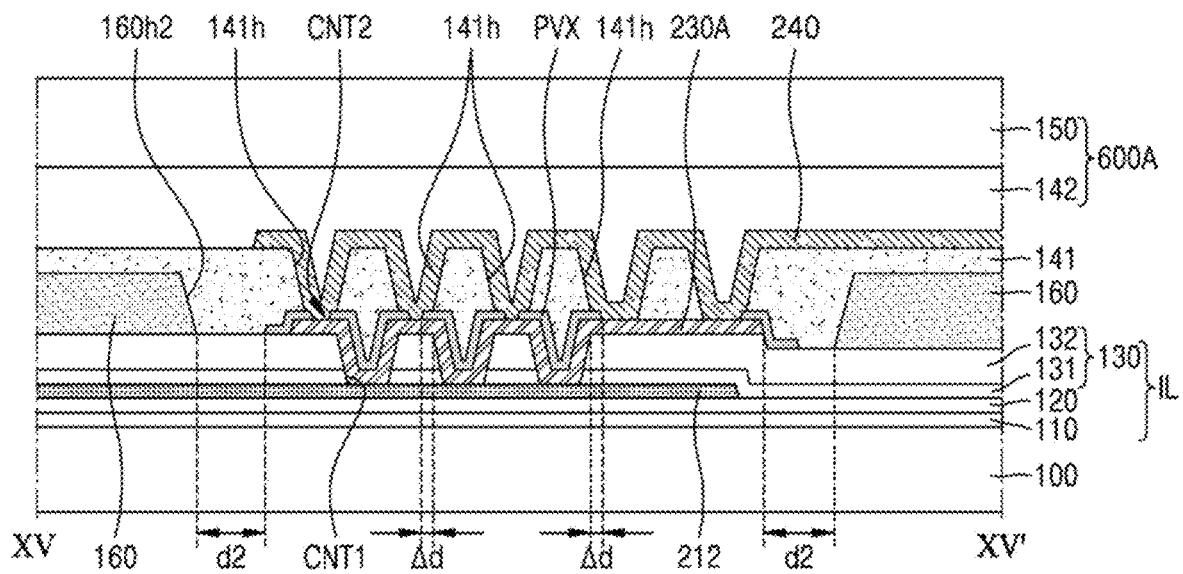
FIG. 15 is a cross-sectional view illustrating the wiring unit taken along a line XV-XV' of FIG. 12.

FIG. 12 is a plan view of a portion of a wiring unit of a display device according to an exemplary embodiment of the present invention, FIG. 13 is a cross-sectional view of the wiring unit taken along a line XIII-XIII' of FIG. 12, FIG. 14 is a cross-sectional view of the wiring unit taken along a line XIV-XIV' of FIG. 12, and FIG. 15 is a cross-sectional view of the wiring unit taken along a line XV-XV' of FIG. 12.

Referring to FIG. 12, the first and second inner wirings 211 and 212 may each extend in the X-direction and may be spaced apart from each other in the Y-direction. The first and second inner wirings 211 and 212 may be disposed in the same layer or respectively disposed in different layers. FIG. 12 illustrates a case where the first and second inner wirings 211 and 212 are disposed in different layers.

The first inner wiring 211 may be connected to the conductive layer 230, and the second inner wiring 212 may be connected to the conductive layer 230A and the additional conductive layer 240. The conductive layer 230 connected to the first inner wiring 211 may be a bridge wiring extending across the bending area BA as described above with reference to FIGS. 3 and 4. Therefore, the first inner wiring 211 may be electrically connected to the first outer wiring of the second area 2A corresponding to the first inner wiring 211 through the conductive layer 230.

The conductive layer 230A connected to the second inner wiring 212 is an island electrode layer described with reference to FIGS. 10 and 11. The second inner wiring 212 may be connected to the additional conductive layer 240, which is a bridge wiring, through the conductive layer 230A.

Therefore, the second inner wiring 212 may be electrically connected to the second outer wiring of the second area 2A corresponding to the second inner wiring 212 through the additional conductive layer 240 by the medium of the conductive layer 230A.

Referring to FIG. 13, the conductive layer 230 and the additional conductive layer 240 may be disposed in different layers. For example, the conductive layer 230 may be formed during the same process as the data line DL (see FIG. 3 or 4) and may include the same material as that of the data line DL. The additional conductive layer 240 may be formed during the same process as the driving voltage line PL (see FIG. 10 or 11) and may include the same material as that of the driving voltage line PL. In the case where the conductive layer 230 and the additional conductive layer 240, which are bridge wirings disposed adjacent to each other, are disposed in different layers, a distance between the conductive layer 230 and the additional conductive layer 240 may be reduced.

Referring to FIG. 12 again, a contact region of the first inner wiring 211 and the conductive layer 230, and a contact region of the second inner wiring 212, the conductive layer 230A, and the additional conductive layer 240 may be disposed in a zigzag form.

The organic layer 160 at least partially overlaps the first and second inner wirings 211 and 212 and the conductive layers 230 and 230A and includes the first and second organic through holes 160h1 and 160h2 for providing contact between the first inner wiring 211 and the conductive layer 230 and between the second inner wiring 212 and the conductive layer 230A. The first organic through hole 160h corresponds to an overlapping portion of the first inner wiring 211 and the conductive layer 230, and the second organic through hole 160h2 corresponds to the second inner wiring 212, the conductive layer 230A, and the additional conductive layer 240 and may be shifted and disposed in a zigzag form.

The inorganic protective layer PVX corresponds to the first and second organic through holes 160h1 and 160h2 and covers the contact region of the first inner wiring 211 and the conductive layer 230 and the contact region of the second inner wiring 212 and the additional conductive layer 240. According to an exemplary embodiment of the present invention, the inorganic protective layer PVX may partially overlap the organic layer 160. For example, the inorganic protective layer PVX may partially overlap at least one of the first and second inner wirings 211 and 212, and/or the conductive layer 230. FIG. 12 illustrates a case where the inorganic protective layer PVX covers the first inner wiring 211 among the first and second inner wirings 211 and 212 and covers the conductive layer 230. The width W1 of the inorganic protective layer PVX covering a portion of the conductive layer 230 may be greater than the width W2 of the conductive layer 230 and may protect the conductive layer 230. However, to facilitate out-gassing of a material included in the organic layer 160, the width W1 may be less than the width W3 of the organic layer 160 as described above.

As described above, the first inner wiring 211 may be directly connected to the conductive layer 230, which is a bridge wiring, but the second inner wiring 212 may be connected to the additional conductive layer 240, which is a bridge wiring, through the conductive layer 230A. Hereinafter, each connection structure is described.

First, a connection structure of the first inner wiring 211 and the conductive layer 230 is described.

Referring to FIGS. 12 and 14, the first inner wiring 211 may be covered by the second interlayer insulating layer 132, and a portion of the first inner wiring 211 may be exposed through the first contact hole CNT1. The organic layer 160 may be disposed on the interlayer insulating layer 130 and may include the first organic through hole 160h1 formed by removing a portion of the organic layer 160 corresponding to the first contact hole CNT1. The conductive layer 230 may be disposed on the organic layer 160, and a portion of the conductive layer 230 corresponding to the first organic through hole 160h1 may be connected to the first inner wiring 211 through the first contact hole CNT1. A portion of the conductive layer 230 corresponding to the first organic through hole 160h1 may be connected to the first inner wiring 211 through the first contact hole CNT1. The first organic through hole 160h1 may be spaced apart by a preset distance "d1" from an end of the first inner wiring 211.

Since the inorganic protective layer PVX covers a portion of the conductive layer 230 corresponding to the first contact hole CNT1, problems such as occurrence of damage and/or a fine crack, and generation of moisture transmission at surroundings of the first contact hole CNT1, for example, in a step difference at the surroundings of the first contact hole CNT1 may be prevented. The inorganic protective layer PVX is not provided to the bending area BA as described with reference to FIG. 3.

The first inner wiring 211, the conductive layer 230, and a contact region thereof may be covered by the protective layer 600A. The first planarization insulating layer 141 may be disposed below the protective layer 600A, for example, between the inorganic protective layer PVX and the protective layer 600A. The first planarization insulating layer 141 may be disposed under the additional conductive layer 240, which will be described later with reference to FIG. 15. The first inner wiring 211, the conductive layer 230, and a contact region thereof may be entirely covered by the first planarization insulating layer 141.

Next, the connection structure of the second inner wiring 212, the conductive layer 230A, and the additional conductive layer 240 is described.

Referring to FIGS. 12 and 15, the second inner wiring 212 may be disposed on the gate insulating layer 120 and may be connected to the conductive layer 230A through the first contact hole CNT1 formed in the interlayer insulating layer 130.

The conductive layer 230A is an island type layer and may be disposed in only a region corresponding to the second organic through hole 160h2. The area of the second organic through hole 160h2 may be greater than the area of the conductive layer 230A, and an edge of the conductive layer 230A may be spaced apart by a preset interval "d2" from a lower end of the second organic through hole 160h2.

The inorganic protective layer PVX may cover a portion of the upper surface of the conductive layer 230A corresponding to the first contact hole CNT1 and so prevent occurrence of damage and/or a fine crack, and generation of moisture transmission at a portion of the conductive layer 230A in a step difference around the first contact hole CNT1. The inorganic protective layer PVX may at least partially overlap a portion corresponding to the first contact hole CNT1, for example, a contact portion of the second inner wiring 212 and the conductive layer 230A, and an inner wall and a portion of the upper surface of the interlayer insulating layer 130 as described above.

Since the inorganic protective layer PVX covers a portion of the conductive layer 230A corresponding to the first contact hole CNT1, the second contact hole CNT2 for providing contact between the conductive layer 230A and the additional conductive layer 240 may be formed in a region different from that of the first contact hole CNT1. For example, the second contact hole CNT2 may be spaced apart from the first contact hole CNT1. A lower edge of the second contact hole CNT2 adjacent to the first contact hole CNT1 may be spaced apart by an interval "Δd" of about 1 μm to 2 μm from an upper edge of the first contact hole CNT1. The "Δd" may be understood as a spaced distance between the first and second contact holes CNT1 and CNT2 adjacent to each other, or as the width of the upper surface of the interlayer insulating layer 130 covered by the inorganic protective layer PVX around the first contact hole CNT1. The first and second contact holes CNT1 and CNT2 may be alternately disposed in the X-direction with the preset interval "Δd".

The first planarization insulating layer 141 is disposed on the inorganic protective layer PVX, and includes the hole 141h corresponding to the second contact hole CNT2. FIG. 15 illustrates a case where the first planarization insulating layer 141 includes a plurality of holes 141h corresponding to the second organic through hole 160h2.

Though FIGS. 12 to 15 illustrate a case where the first inner wiring 211 is disposed on the first interlayer insulating layer 131, and the second inner wiring 212 is disposed on the gate insulating layer 120, however, the present invention is not limited to this particular arrangement. For example, the first inner wiring 211 may be disposed on the gate insulating layer 120, and the second inner wiring 212 may be disposed on the first interlayer insulating layer 131. According to an exemplary embodiment of the present invention, the first and second inner wirings 211 and 212 may be disposed in the same layer and may include the same material.

FIGS. 12 to 15 describe a structure in which the inner wiring 210 is connected to the conductive layer 230, or the conductive layer 230A and the additional conductive layer 240. However, such a structure is equally applicable to a structure in which the outer wiring 220 is connected to the conductive layer 230, or to the conductive layer 230A and the additional conductive layer 240.

Figure 16:
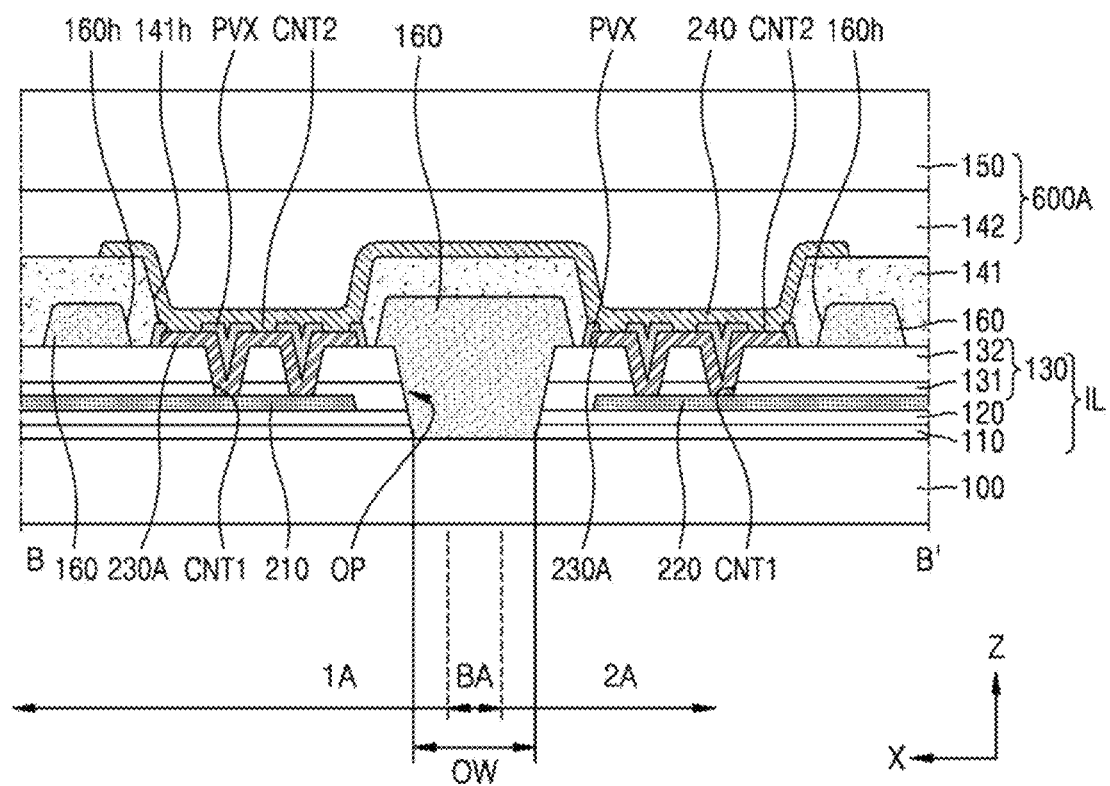
FIG. 16 is a cross-sectional view illustrating a non-display area of a display device according to an exemplary embodiment of the present invention.
Figure 17:
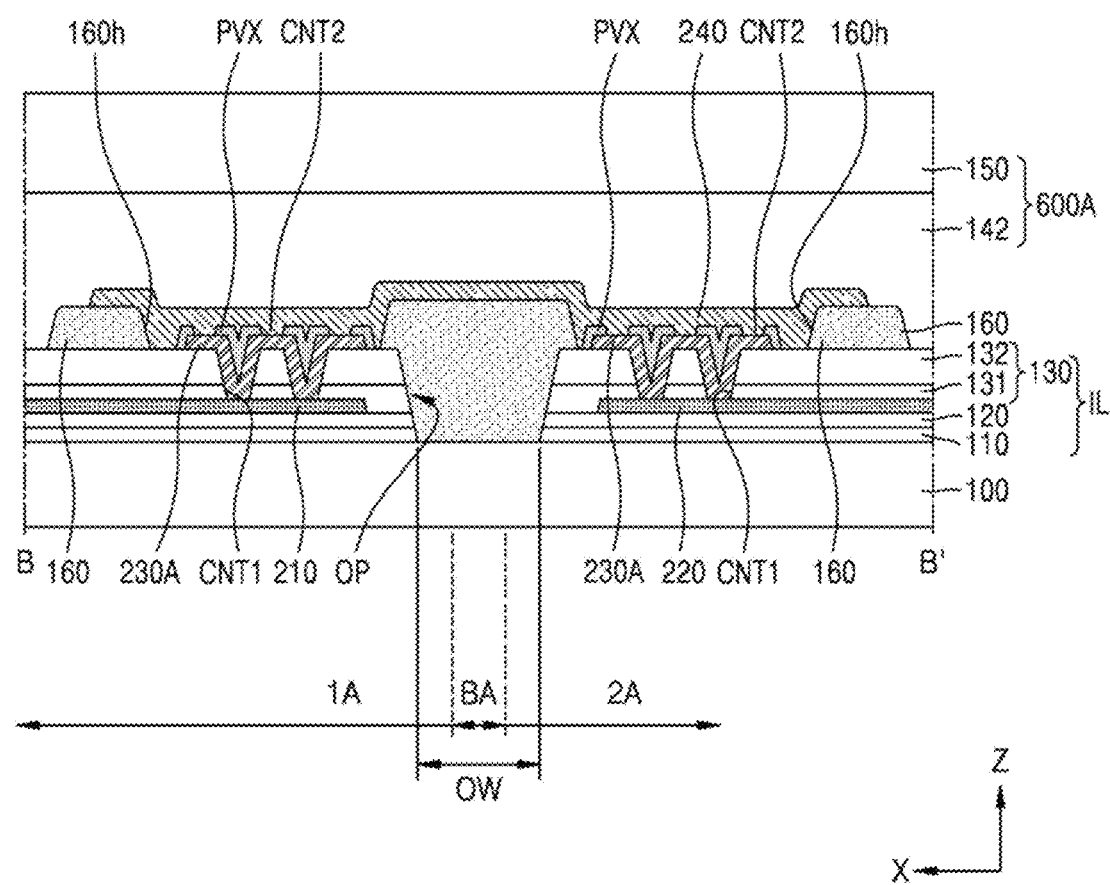
FIG. 17 is a cross-sectional view illustrating a non-display area of a display device according to an exemplary embodiment of the present invention.

FIGS. 16 and 17 are cross-sectional views of a non-display area of a display device according to an exemplary embodiment of the present invention. In FIGS. 16 and 17, same reference numerals as those of the configuration of FIG. 10 may represent the same or similar elements and to the extent that details are not described, they may be assumed to be at least similar to the details of corresponding elements described elsewhere in the disclosure.

Referring to FIG. 16, one hole 141h may be provided to the first planarization insulating layer 141. For example, the hole 141h of the first planarization insulating layer 141 may correspond to the organic through hole 160h of the organic layer 160 and may be disposed to expose the second contact hole CNT2. The hole 141h of the first planarization insulating layer 141 may be less than the organic through hole 160h and so may provide increased step coverage of the additional conductive layer 240 on the first planarization insulating layer 141.

Referring to FIG. 17, the first planarization insulating layer 141 (see FIG. 10) might not be disposed under the additional conductive layer 240.

FIGS. 16 and 17 illustrate a case where the inner wiring 210 and the outer wiring 220 are disposed in the same layer (e.g. the gate insulating layer), however, the present invention is not limited thereto. The inner wiring 210 and the outer wiring 220 may be disposed on the first interlayer insulating layer 131 as illustrated in FIG. 11. In an exemplary embodiment of the present invention, the inner wiring 210 and the outer wiring 220 may be respectively disposed in different layers.

Figure 18:
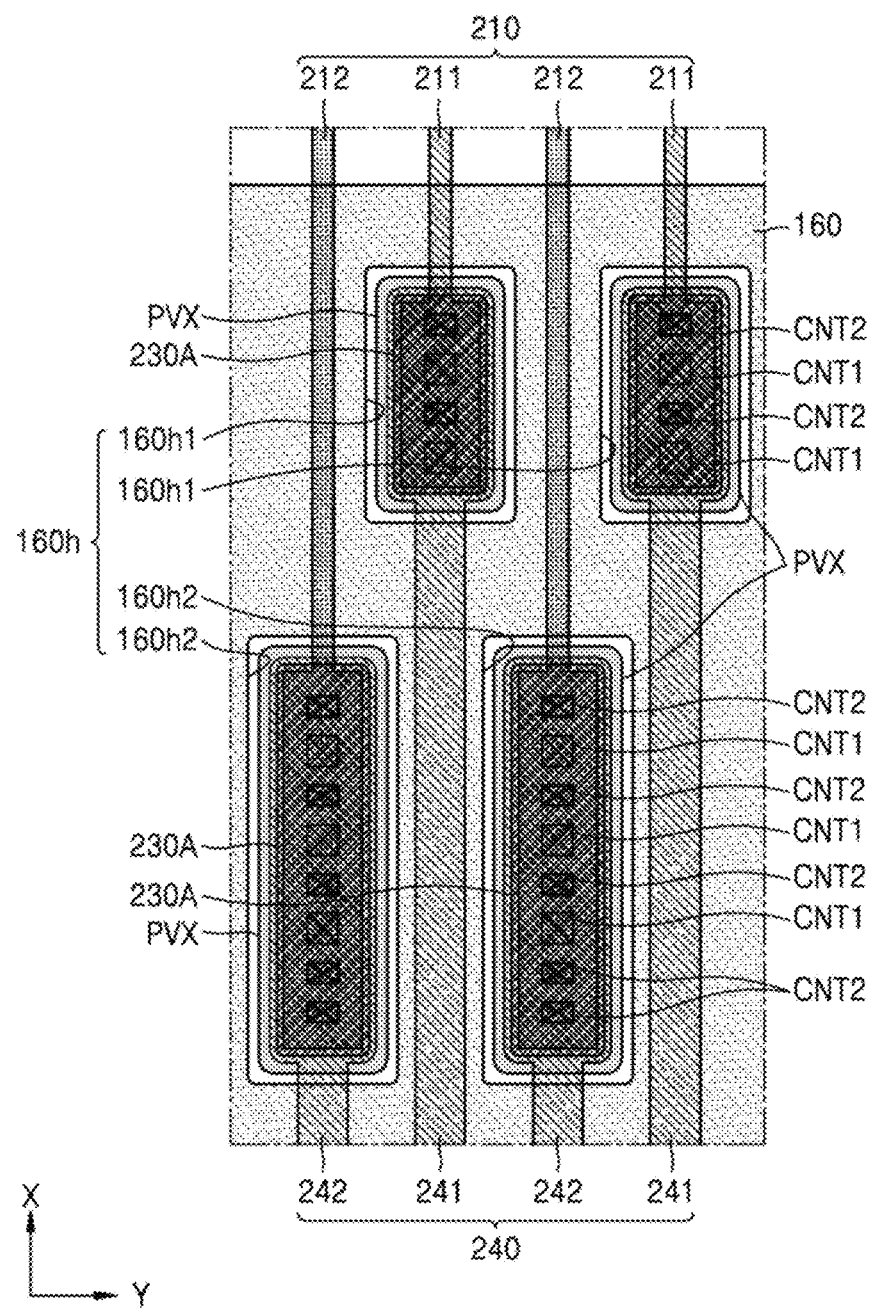
FIG. 18 is a plan view illustrating a wiring unit of a display device according to an exemplary embodiment of the present invention.

FIG. 18 is a plan view of a wiring unit of a display device according to an exemplary embodiment of the present invention. In FIG. 18, same reference numerals as those of FIG. 12 may represent the same or similar elements and to the extent that details are not described, they may be assumed to be at least similar to the details of corresponding elements described elsewhere in the disclosure.

FIG. 12 illustrates a structure in which one of the first and second inner wirings 211 and 212 is connected to the conductive layer 230 serving as a bridge wiring, and the other is connected to the additional conductive layer 240 serving as a bridge wiring by the medium of the island type conductive layer 230A. Here, both the first and second inner wirings 211 and 212 illustrated in FIG. 18 may be connected to the additional conductive layer 240 by the medium of the conductive layer 230A.

Referring to FIG. 18, the first and second inner wirings 211 and 212 may be respectively connected to the first and second additional conductive layers 241 and 242 serving as bridge wirings by the medium of the island type conductive layer 230A.

The first inner wiring 211, the island type conductive layer 230A, and the first additional conductive layer 241 at least partially overlap one another in a region corresponding to the first organic through hole 160h1. The first inner wiring 211 may be connected to the conductive layer 230A through the first contact hole CNT1 of the interlayer insulating layer, and the conductive layer 230A may be connected to the first additional conductive layer 241 through the second contact hole CNT2 of the inorganic protective layer PVX.

Likewise, the second inner wiring 212, the island type conductive layer 230A, and the second additional conductive layer 242 at least partially overlap one another in a region corresponding to the second organic through hole 160h2. The second inner wiring 212 may be connected to the conductive layer 230A through the first contact hole CNT1 of the interlayer insulating layer, and the conductive layer 230A may be connected to the second additional conductive layer 242 through the second contact hole CNT2 of the inorganic protective layer PVX.

The inorganic protective layer PVX may be disposed inside the first and second organic through holes 160h1 and 160h2 and may cover an upper portion of the conductive layer 230A corresponding to the first contact hole CNT1. In FIG. 18, the inorganic protective layer PVX may extend to at least partially overlap one of the first and second inner wirings 211 and 212.

Since a contact structure of the first inner wiring 211, the conductive layer 230A, and the first additional conductive layer 241 is substantially the same as a contact structure of the second inner wiring 211, the conductive layer 230A, and the second additional conductive layer 242, and these structures are the same as those of the embodiment described with reference to FIG. 15, and to the extent that details are not described, they may be assumed to be at least similar to the details of corresponding elements described elsewhere in the disclosure.

According to an exemplary embodiment of the present invention, the contact structure of the first inner wiring 211, the conductive layer 230A, and the first additional conductive layer 241, and the contact structure of the second inner wiring 211, the conductive layer 230A, and the second additional conductive layer 242 may be modified to a structure in which one hole 141h is provided to the first planarization insulating layer 141, or a structure in which the first planarization insulating layer 141 is omitted in the non-display area NDA as described with reference to FIGS. 16 and 17.

FIGS. 3 to 18 illustrate a structure in which the organic layer 160 is disposed under the conductive layers 230 and 230A, however, the present invention is not limited thereto. If the conductive layer 230 and/or the additional conductive layer 240, which are bridge wirings in the bending area BA, are flexible, which may endure stress while they are bent, the organic layer 160 may be omitted.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

What is claimed is:

1. A display device, comprising:
   a substrate comprising a first area, a second area, and a bending area between the first area and the second area;
   a first wiring disposed in the first area;
   a second wiring disposed in the second area and spaced apart from the first wiring;
   a conductive layer extending across the bending area and electrically coupling the first wiring to the second wiring, the conductive layer comprising a bottom surface facing the substrate and a top surface opposite to the bottom surface; and
   an inorganic protective layer on the top surface of the conductive layer and covering a first edge of the conductive layer, in the first area, and covering a second edge of the conductive layer, in the second area, wherein the inorganic protective layer has an opening in the bending area that extends through a full thickness of the inorganic protective layer such that the inorganic protective layer in the first area is not connected to the inorganic protective layer in the second area.

2. The display device of claim 1, further comprising;
   at least one insulating layer on the first and the second wirings, the at least one insulating layer having a first contact hole and a second contact hole,
   wherein a first portion of the conductive layer is connected to the first wiring via the first contact hole and a second portion of the conductive layer is connected to the second wiring via the second contact hole.

3. The display device of claim 2, wherein the at least one insulating, layer has an opening in the bending area.

4. The display device of claim 3, further comprising:
   an organic insulating layer, at least a portion of the organic insulating layer being in the opening of the at least one insulating layer.

5. The display device of claim 4, wherein the organic insulating layer has a through hole overlapping the first contact hole, and the through hole is defined by a hole edge of the organic insulting layer,
   wherein an edge of the first wiring is spaced apart from the hole edge of the organic insulting layer.

6. The display device of claim 2, wherein the at least one insulating aver comprises an inorganic insulating material.

7. The display device of claim 1, wherein the conductive layer comprises a multi-layered structure that includes a first metal element and a second metal element different from the first metal element.

8. The display device of claim 7, wherein the multi-layered structure comprises a Ti layer, an Al layer, and a Ti layer sequentially stacked.

9. The display device of claim 1, further comprising:
   a protective layer disposed on the conductive layer in the bending area, and including an organic insulating material.

10. A display device, comprising:
    a substrate including a bending area between a first area and a second area, the substrate being bent in relation to a bending axis;
    a first insulating layer on the substrate;
    a first wiring disposed on the first insulating layer in the first area;
    a second wiring disposed on the first insulating layer in the second area, the first and second wirings being spaced apart from each other;
    a conductive layer extending across the bending area and electrically coupling the first wiring to the second wiring, the conductive layer comprising a bottom surface facing the substrate and a top surface opposite to the bottom surface; and
    an inorganic protective layer on the top surface of the conductive layer, the inorganic protection layer including a first part covering a top surface of a first edge portion of the conductive layer in the first area, and a second part covering a top surface of a second edge portion of the conductive layer in the second area, wherein the inorganic protective layer has an opening in the bending area, and the first part and the second part of the inorganic protective layer are separated from each other with respect to the opening.

11. The display device of claim 10, further comprising:
    a second insulating layer on the first and the second wirings, the second insulating layer having a plurality of contact holes,
    wherein the conductive layer is connected to the first wiring and the second wiring via the plurality of contact holes.

12. The display device of claim 11, wherein the first and second insulating layers comprise an inorganic insulating material and has an opening in the bending area.

13. The display device of claim 12, further comprising:
    an organic insulating layer, at least a portion of the organic insulating layer being in the opening of the first and second insulating layers.

14. The display device of claim 13, wherein the organic insulating layer has a through hole overlapping the plurality of contact holes.

15. The display device of claim 11, wherein the conductive layer comprises a multi-layered structure that includes a first metal element and a second metal element different from the first metal element.

16. The display device of claim 15, wherein the multi-layered structure comprises a Ti layer, an Al layer, and a Ti layer sequentially stacked.

17. The display device of claim 1, wherein the inorganic protective layer is absent from the bending, area.

18. The display device of claim 10, wherein the inorganic protective layer is absent from the bending area.

* * * * *